US009741887B2

(12) United States Patent
Woo et al.

(10) Patent No.: US 9,741,887 B2
(45) Date of Patent: Aug. 22, 2017

(54) SOLAR CELL MODULE

(71) Applicant: LG ELECTRONICS INC., Seoul (KR)

(72) Inventors: Taeki Woo, Seoul (KR); Minpyo Kim, Seoul (KR); Daehee Jang, Seoul (KR); Bojoong Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 274 days.

(21) Appl. No.: 14/599,120

(22) Filed: Jan. 16, 2015

(65) Prior Publication Data
US 2015/0207003 A1    Jul. 23, 2015

(30) Foreign Application Priority Data

Jan. 20, 2014 (KR) .................. 10-2014-0006504

(51) Int. Cl.
H01L 31/056 (2014.01)
H01L 31/0224 (2006.01)
H01L 31/05 (2014.01)
H01L 31/054 (2014.01)
H01L 31/048 (2014.01)

(52) U.S. Cl.
CPC .... H01L 31/056 (2014.12); H01L 31/022441 (2013.01); H01L 31/048 (2013.01); H01L 31/0508 (2013.01); H01L 31/0516 (2013.01); H01L 31/0547 (2014.12); Y02E 10/52 (2013.01)

(58) Field of Classification Search
CPC . H01L 31/048; H01L 31/0547; H01L 31/056; H01L 31/052

USPC ........................................................ 136/246
See application file for complete search history.

(56) References Cited

U.S. PATENT DOCUMENTS

| 4,313,023 | A | | 1/1982 | Stephens |
| 5,994,641 | A | * | 11/1999 | Kardauskas .......... H01L 31/048 |
| | | | | 136/246 |
| 6,323,415 | B1 | | 11/2001 | Uematsu et al. |
| 2007/0125415 | A1 | | 6/2007 | Sachs |
| 2010/0108123 | A1 | | 5/2010 | åsberg et al. |
| 2010/0147363 | A1 | | 6/2010 | Huang et al. |

(Continued)

FOREIGN PATENT DOCUMENTS

CN 102664210 A 9/2012
DE 112013002371 T5 1/2015
(Continued)

Primary Examiner — Jayne Mershon
(74) Attorney, Agent, or Firm — Birch, Stewart, Kolasch & Birch, LLP

(57) ABSTRACT

A solar cell module is discussed, which includes a plurality of strings each including a plurality of solar cells, which are connected in series to one another through an interconnector, a front transparent substrate disposed on front surfaces of the plurality of strings, a first encapsulant disposed between the front transparent substrate and the front surfaces of the plurality of strings, a first reflector disposed in a first space between the plurality of solar cells included in each string, which are separated from one another in a first direction corresponding to a longitudinal direction of each string, and a second reflector disposed in a second space between the plurality of strings, which are separated from one another in a second direction crossing the first direction. The first and second reflectors reflect incident light.

17 Claims, 22 Drawing Sheets

(56) References Cited

U.S. PATENT DOCUMENTS

| | | |
|---|---|---|
| 2010/0206352 A1 | 8/2010 | Gee et al. |
| 2010/0243029 A1 | 9/2010 | Higashi et al. |
| 2012/0118352 A1 | 5/2012 | Asami |
| 2013/0298965 A1 | 11/2013 | Liu et al. |
| 2014/0000706 A1* | 1/2014 | Mandokoro ............. C08J 7/047 |
| | | 136/259 |
| 2014/0102515 A1 | 4/2014 | Sakuma et al. |
| 2015/0059831 A1* | 3/2015 | Fukumochi ........... H01L 31/048 |
| | | 136/246 |

FOREIGN PATENT DOCUMENTS

| | | |
|---|---|---|
| EP | 2677554 A1 | 12/2013 |
| JP | 7-18458 U | 3/1995 |
| JP | 11-307791 A | 11/1999 |
| JP | 2002-513210 A | 5/2002 |
| JP | 2009-518823 A | 5/2009 |
| JP | 2010-238863 A | 5/2009 |
| JP | 2010-517315 A | 5/2010 |
| JP | 2010-287688 A | 12/2010 |
| JP | 2012-119668 A | 6/2012 |
| JP | 2013-8785 A | 1/2013 |
| JP | 2013-42078 A | 2/2013 |
| JP | 2013-98496 A | 5/2013 |
| JP | 2013-161986 A | 8/2013 |
| JP | WO 2013/168612 * | 11/2013 |
| WO | WO 99/56317 A1 | 11/1999 |
| WO | WO 2013/168612 A1 | 11/2013 |
| WO | WO 2013/170483 A1 | 11/2013 |

* cited by examiner (a)

(b)

(c)

SOLAR CELL MODULE

CROSS-REFERENCE TO RELATED APPLICATION

This application claims priority to and the benefit of Korean Patent Application No. 10-2014-0006504 filed in the Korean Intellectual Property Office on Jan. 20, 2014, the entire contents of which are incorporated herein by reference.

BACKGROUND OF THE INVENTION

Field of the Invention

Embodiments of the invention relate to a solar cell module.

Description of the Related Art

A solar cell generally includes a substrate and an emitter region, which are formed of semiconductors of different conductive types, for example, a p-type and an n-type, and electrodes respectively connected to the substrate and the emitter region. A p-n junction is formed at an interface between the substrate and the emitter region.

In particular, a solar cell, in which electrodes are not formed on a light receiving surface of a silicon substrate and n-type electrodes and p-type electrodes are formed only on another surface of the silicon substrate, has been continuously studied and developed, so as to increase efficiency of the solar cell. Further, a module technology for electrically connecting the plurality of solar cells each having the above-described configuration has been continuously studied and developed.

Examples of the module technology typically include a method for electrically connecting the plurality of solar cells using metal interconnectors and a method for electrically connecting the plurality of solar cells using a wiring substrate, on which wires are previously formed.

SUMMARY OF THE INVENTION

In one aspect, there is a solar cell module including a plurality of strings each including a plurality of solar cells, which are connected in series to one another through an interconnector, each of the plurality of strings extending in a first direction, a front transparent substrate disposed on front surfaces of the plurality of strings, a first encapsulant disposed between the front transparent substrate and the front surfaces of the plurality of strings, a first reflector disposed in a first space between the plurality of solar cells included in each string, which are separated from one another in the first direction corresponding to a longitudinal direction of the each string, the first reflector reflecting incident light, and a second reflector disposed in a second space between the plurality of strings, which are separated from one another in a second direction crossing the first direction, the second reflector reflecting incident light.

Each of the plurality of solar cells may include a semiconductor substrate configured to form a p-n junction, and a plurality of first electrodes and a plurality of second electrodes which are formed on a back surface of the semiconductor substrate and are separated from each other.

The first reflector may be disposed between the semiconductor substrates included in the plurality of solar cells of each string and may extend in the second direction. Further, the second reflector may be disposed between the semiconductor substrate of a solar cell included in one string and the semiconductor substrate of a solar cell included in another string adjacent to the one string and may extend in the first direction.

Each of the plurality of solar cells may further include a first conductive line connected to the plurality of first electrodes using a conductive adhesive, and a second conductive line connected to the plurality of second electrodes using the conductive adhesive.

In this instance, the interconnector may be connected to the first conductive line connected to one solar cell and the second conductive line connected to another solar cell adjacent to the one solar cell.

The first reflector may be formed on a front surface of the interconnector and may form one body along with the interconnector. On the contrary, the first reflector may be separated from the interconnector and may be formed on a front surface of the interconnector.

A sum of a thickness of the first reflector and a thickness of the interconnector may be greater than a thickness of a semiconductor substrate included in each solar cell.

A plurality of uneven portions may be formed on a front surface of each of the first reflector and the second reflector.

The plurality of uneven portions of the first reflector may include a plurality of first protrusions each extending in the second direction.

An inclination angle of the first protrusions in the first reflector, positioned between the solar cells adjacent to each other in the first direction, may increase as it goes farther away from the adjacent solar cells.

The second reflector may not overlap the semiconductor substrates of the solar cells and may be spatially separated from the semiconductor substrates of the solar cells.

The plurality of uneven portions of the second reflector may include a plurality of second protrusions each extending in the first direction.

An inclination angle of the second protrusions in the second reflector, positioned between the solar cells adjacent to each other in the second direction, may increase as it goes farther away from the adjacent solar cells.

A thickness of the second reflector may be greater than a thickness of the semiconductor substrate included in each solar cell.

Each of the first and second reflectors may contain a conductive material or an insulating material. For example, each of the first and second reflectors may include a body part formed of an insulating material and a coating part formed of a metal material coated on a front surface of the body part.

The solar cell module may further include an outermost reflector having a plurality of uneven portions positioned outside the plurality of solar cells when viewing the solar cell module from its front surface. An inclined surface formed by the plurality of uneven portions of the outermost reflector may face only the plurality of solar cells positioned inside the outermost reflector.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will not be discussed if it is determined that the discussion of the known arts can obscure the embodiments of the invention.

In the following description, "front surface" may be one surface of a semiconductor substrate, on which light is directly incident, or one surface of a front glass substrate, and "back surface" may be a surface opposite the one surface of the semiconductor substrate or the front glass substrate, on which light is not directly incident or reflective light may be incident.

Example embodiments of the invention will be described with reference to FIGS. 1 to 22.

FIGS. 1 to 5 illustrate a solar cell module according to a first embodiment of the invention.

Figure 1:
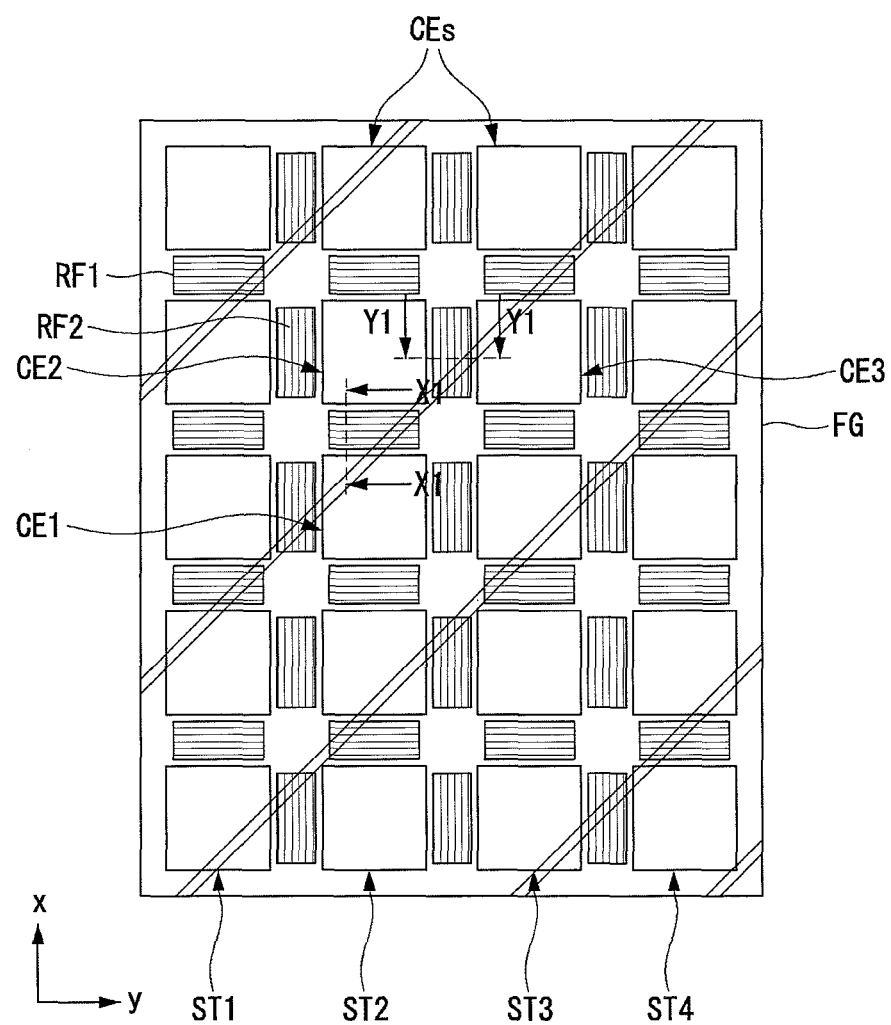
FIGS. 1 to 5 illustrate a solar cell module according to a first embodiment of the invention.
Figure 2A:
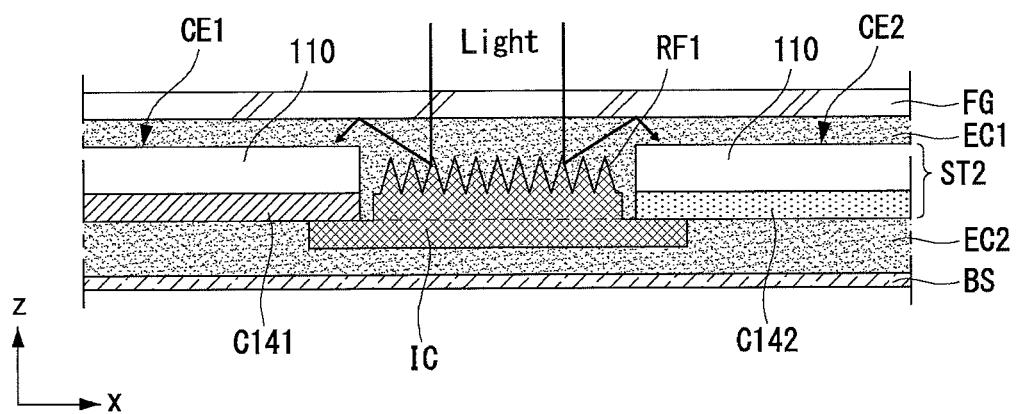
Figure 2B:
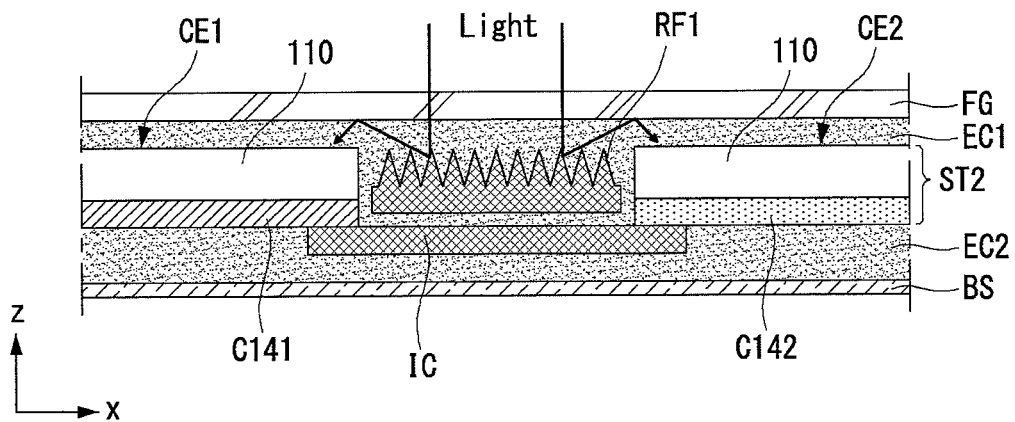
Figure 3:
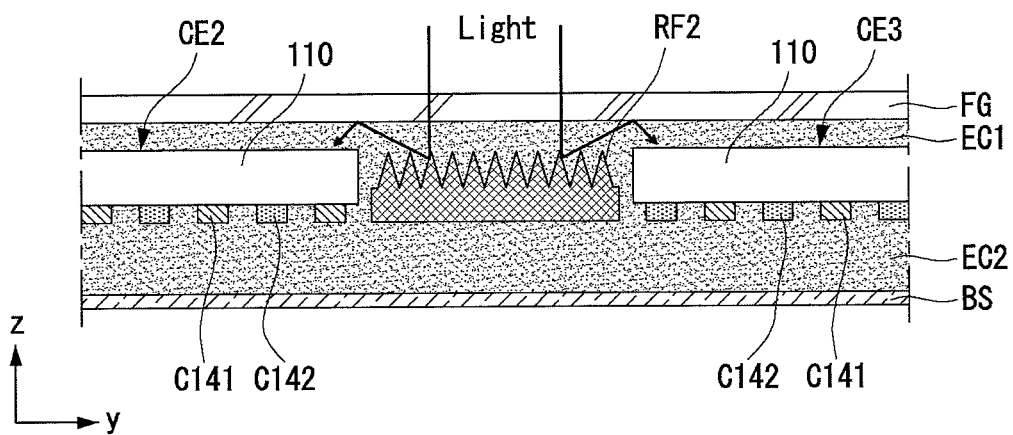
Figure 4A:
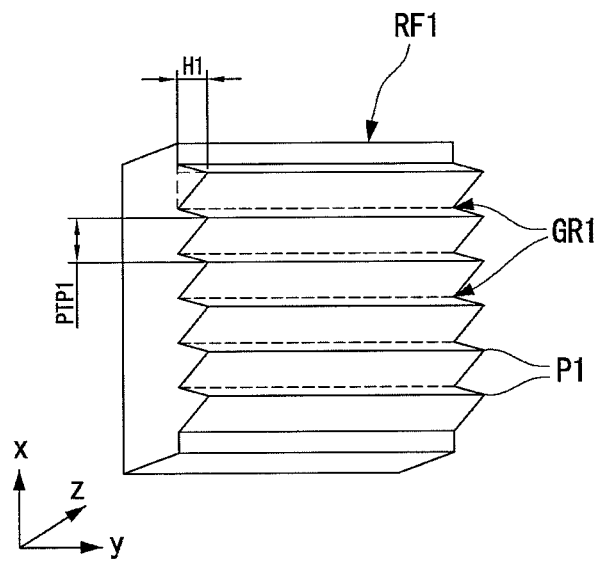
Figure 4B:
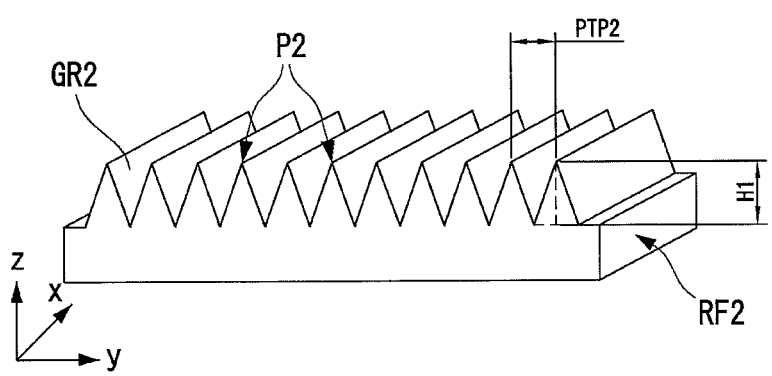
Figure 5:
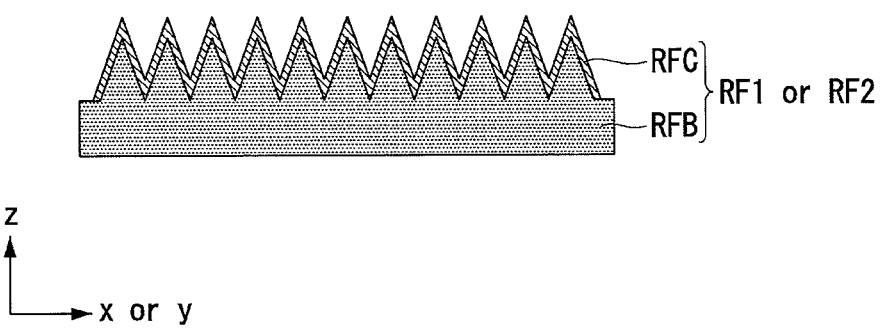

More specifically, FIG. 1 is a plane view of the solar cell module according to the first embodiment of the invention. FIG. 2A shows an example of a cross-sectional view taken along line X1-X1 of FIG. 1, and FIG. 2B shows another example of a cross-sectional view taken along line X1-X1 of FIG. 1. FIG. 3 shows an example of a cross-sectional view taken along line Y1-Y1 of FIG. 1. FIG. 4A shows an example of a first reflector shown in FIG. 1, and FIG. 4B shows an example of a second reflector shown in FIG. 1. FIG. 5 illustrates a material of the first and second reflectors shown in FIG. 1.

The solar cell module according to the first embodiment of the invention may include a front transparent substrate FG, a first encapsulant EC1, a plurality of strings ST1 to ST4, a second encapsulant EC2, and a back sheet BS.

As shown in FIGS. 1 to 3, the front transparent substrate FG may be positioned on front surfaces of the plurality of strings ST1 to ST4 including the first string ST1 and the second string ST2. The front transparent substrate FG may be formed of a tempered glass having a high transmittance and a damage prevention function.

The first encapsulant EC1 may be positioned between the front transparent substrate FG and the plurality of strings ST1 to ST4, and the second encapsulant EC2 may be positioned on back surfaces of the plurality of strings ST1 to ST4, namely, between the back sheet BS and the plurality of strings ST1 to ST4.

The first encapsulant EC1 and the second encapsulant EC2 may be formed of a material which prevents corrosion of a metal resulting from the moisture penetration and protects the solar cell module from an impact.

As shown in FIGS. 2A to 3, a lamination process is performed in a state where the first encapsulant EC1 and the second encapsulant EC2 are respectively positioned on and under the plurality of strings ST1 to ST4, and thus the first encapsulant EC1, the second encapsulant EC2, and the plurality of strings ST1 to ST4 may form one body.

The first encapsulant EC1 and the second encapsulant EC2 may be formed of ethylene vinyl acetate (EVA). Other materials may be used.

The back sheet BS of a sheet type may be positioned on a back surface of the second encapsulant EC2 and may prevent the moisture from penetrating into a back surface of the solar cell module.

When the back sheet BS is formed in the sheet type as described above, the back sheet BS may be formed of an insulating material, for example, FP/PE/FP (fluoropolymer/polyester/fluoropolymer).

As shown in FIG. 1, each of the plurality of strings ST1 to ST4 may include a plurality of solar cells CEs, which are connected in series to one another, and may extend in a first direction x. Further, the plurality of strings ST1 to ST4 may be separated from one another in a second direction y. For example, the first string ST1 and the second string ST2 may be separated from each other in the second direction y.

In the embodiment disclosed herein, each of the plurality of solar cells CEs may include a semiconductor substrate 110 and a plurality of first and second electrodes C141 and C 142, which are formed on a back surface of the semiconductor substrate 110 and are separated from each other. This will be described in detail later with reference to FIGS. 12 and 13.

The plurality of solar cells CEs included in each of the plurality of strings ST1 to ST4 may be electrically connected through interconnectors IC formed of a conductive material and may be separated in the first direction x.

For example, as shown in FIG. 2A or 2B, first and second solar cells CE1 and CE2, which are positioned adjacent to each other, may be electrically connected through the interconnector IC.

Both ends of the interconnector IC may be electrically connected to first and second electrodes C141 and C 142 positioned on back surfaces of semiconductor substrates 110 of the first and second solar cells CE1 and CE2.

As shown in FIG. 1, the solar cell module according to the embodiment of the invention may include a first reflector RF1 and a second reflector RF2, each of which reflects incident light.

The first reflector RF1 may be positioned between the plurality of solar cells CEs, which are included in each of the strings ST1 to ST4 and are separated in the first direction x. Namely, as shown in FIG. 1, the first reflector RF1 may be positioned in a space between the solar cells CEs separated in the first direction x in each of the strings ST1 to ST4 and may extend in the second direction y.

Further, as shown in FIG. 1, the second reflector RF2 may be positioned in a space between the strings ST1 to ST4 separated in the second direction y and may extend in the first direction x. For example, the second reflector RF2 extending in the first direction x may be positioned between the second and third strings ST2 and ST3.

As shown in FIGS. 2A to 3, the first and second reflectors RF1 and RF2, each of which functions to reflect incident light, may cause each solar cell to receive much more light.

More specifically, as shown in FIG. 2A, the first reflector RF1 may be formed on a front surface of the interconnector IC in the cross section of the solar cell module including the first reflectors RF1 shown in FIG. 1. Alternatively, as shown in FIG. 2B, the first reflector RF1 may overlap the front surface of the interconnector IC and also may be separated from the front surface of the interconnector IC.

In this instance, the first reflector RF1 may be positioned between the semiconductor substrates 110 of the first and second solar cells CE1 and CE2 included in the second string ST2 and may be separated from the semiconductor substrates 110 of the first and second solar cells CE1 and CE2.

Thus, the first reflector RF1 may be spatially separated from the semiconductor substrate 110 of each solar cell, so that the first reflector RF1 and the semiconductor substrate 110 of each solar cell are not short-circuited.

As shown in FIGS. 2A and 2B, the first reflector RF1 may have a plurality of uneven portions on its front surface.

As shown in FIG. 4A, the plurality of uneven portions of the first reflector RF1 may have a plurality of first protrusions P1 each protruding in the second direction y.

More specifically, the plurality of first protrusions P1 and a plurality of first valleys GR1 may be formed in the cross section of the first reflector RF1 in the first direction x. The plurality of first protrusions P1 and the plurality of first valleys GR1 may extend in the second direction y.

Thus, light incident on the first reflector RF1 may be incident on the solar cells positioned on both sides of the first reflector RF1. For example, as shown in FIGS. 1 and 2A, when the first reflector RF1 is positioned between the first and second solar cells CE1 and CE2 included in the second string ST2, light incident on the first reflector RF1 may be incident on the first and second solar cells CE1 and CE2.

A distance PTP1 between the plurality of first protrusions P1 may be 10 µm to 200 µm, so as to minimize a trapping amount of light reflected from the first reflector RF1 due to the front transparent substrate FG. Further, a height H1 of each first protrusion P1 may be 3 µm to 100 µm.

As shown in FIG. 1, the second reflector RF2 may be positioned between the second solar cell CE2 included in the second string ST2 and the third solar cell CE3 included in the third string ST3 adjacent to the second string ST2 in the cross section of the solar cell module including the second reflectors RF2. As shown in FIG. 3, the second reflector RF2 may be separated from the semiconductor substrates 110 of the second and third solar cells CE2 and CE3.

As shown in FIG. 3, the second reflectors RF2 may have a plurality of uneven portions on its front surface.

As shown in FIG. 4B, the plurality of uneven portions of the second reflector RF2 may have a plurality of second protrusions P2 each protruding in the first direction y.

More specifically, the plurality of second protrusions P2 and a plurality of second valleys GR2 may be formed in the cross section of the second reflector RF2 in the second direction y. The plurality of second protrusions P2 and the plurality of second valleys GR2 may extend in the first direction x.

Thus, light incident on the second reflector RF2 may be incident on the solar cells included in the strings positioned on both sides of the second reflector RF2. For example, as shown in FIG. 1, when the second reflector RF2 is positioned between the second solar cell CE2 of the second string ST2 and the third solar cell CE3 of the third string ST3, light incident on the second reflector RF2 may be incident on the second and third solar cells CE2 and CE3 arranged in the second direction y.

A distance PTP2 between the plurality of second protrusions P2 may be 10 µm to 200 µm, and a height H2 of each second protrusion P2 may be 3 µm to 100 µm.

As described above, the solar cell module according to the first embodiment of the invention includes the first and second reflectors RF1 and RF2 on the four sides of each solar cell and reflects light reflected from the first and second reflectors RF1 and RF2 toward the solar cells, thereby further improving the efficiency of the solar cell module.

The first and second reflectors RF1 and RF2 may be formed of a conductive material and also may be formed of the same conductive material as the interconnector IC.

For example, the first and second reflectors RF1 and RF2 may be formed of a metal material having an excellent light reflectance. More specifically, the first and second reflectors RF1 and RF2 may be formed by plating tin (Sn) or nickel (Ni) onto a metal material, such as copper (Cu), aluminum (Al), silver (Ag), and gold (Au).

The surfaces of the first and second protrusions P1 and P2 of the first and second reflectors RF1 and RF2 formed of the conductive material may contain aluminum oxide ($Al_2O_3$) of white or carbon of black.

On the contrary, the first and second reflectors RF1 and RF2 may contain an insulating material.

For example, the first and second reflectors RF1 and RF2 may contain the insulating material, such as silicon oxide (SiOx), titanium oxide (TiOx), and a polymer-based material.

In the embodiment disclosed herein, the polymer-based material may be, for example, polyethylene terephthalate (PET) or polyethylene.

The first and second reflectors RF1 and RF2 may be formed of only the insulating material. Further, a metal material having a relatively higher reflectance may be coated on the surface of the insulating material, so as to increase a surface reflectance.

For example, as shown in FIG. 5, each of the first and second reflectors RF1 and RF2 may include a body part RFB formed of the insulating material and a coating part RFC formed of the metal material coated on a front surface of the body part RFB.

The body part RFB may be formed of the insulating material such as silicon oxide (SiOx), titanium oxide (TiOx), and polyethylene terephthalate (PET). The coating part RFC may be formed of the metal material having the relatively higher reflectance, such as aluminum (Al), silver (Ag), and gold (Au).

So far, the embodiment of the invention described that a plurality of inclination angles of a plurality of inclined surfaces formed by the plurality of first protrusions P1 and the plurality of first valleys GR1 of the first reflector RF1 are equal to one another, and also a plurality of inclination angles of a plurality of inclined surfaces formed by the plurality of second protrusions P2 and the plurality of second valleys GR2 of the second reflector RF2 are equal to one another, as an example. However, the plurality of inclination angles may be different from one another.

This is described in detail below with reference to FIGS. 6A and 6B.

Figure 6A:
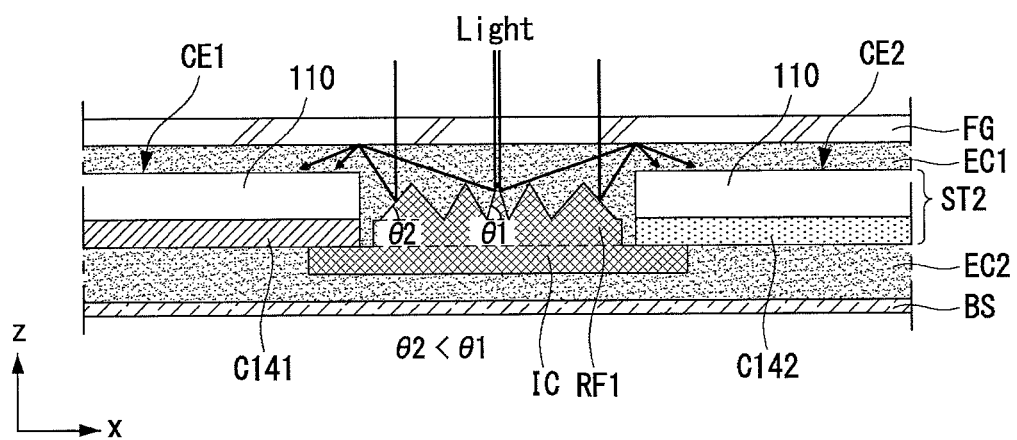
FIGS. 6A and 6B show a first modified example of first and second reflectors in the solar cell module according to the first embodiment of the invention.
Figure 6B:
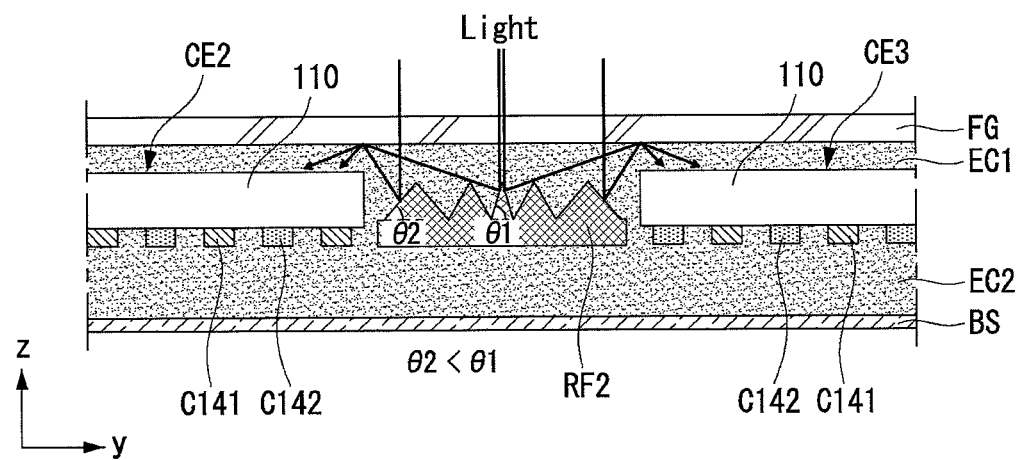

FIGS. 6A and 6B show a first modified example of the first and second reflectors in the solar cell module according to the first embodiment of the invention.

An inclination angle of the first protrusion P1 of the first reflector RF1 may increase as it goes farther away from the solar cells, which are adjacent to each other in the first direction x.

For example, as shown in FIG. 6A, an inclination angle of an inclined surface formed by the first protrusion P1 and the first valley GR1 of the first reflector RF1 may increase as it goes farther away from the first and second solar cells CE1 and CE2 which are adjacent to each other in the first direction x.

Namely, as shown in FIG. 6A, a first inclination angle θ1 of an inclined surface formed in the middle of the first reflector RF1 may be greater than a second inclination angle θ2 of an inclined surface formed at an edge of the first reflector RF1.

Thus, the inclined surface formed by the first protrusion P1 and the first valley GR1 of the first reflector RF1 may be the sharpest in the middle of the first reflector RF1. Further, the inclination angle may decrease (i.e., the inclined surface may be relatively slow) as it approaches the first and second solar cells CE1 and CE2 which are adjacent to each other in the first direction x.

Further, an inclination angle of the second protrusion P2 of the second reflector RF2 may increase as it goes farther away from the solar cells, which are adjacent to each other in the second direction y.

For example, as shown in FIG. 6B, an inclination angle of an inclined surface formed by the second protrusion P2 and the second valley GR2 of the second reflector RF2 may increase as it goes farther away from the second and third solar cells CE2 and CE3 which are adjacent to each other in the second direction y.

Namely, as shown in FIG. 6B, a first inclination angle θ1 of an inclined surface formed in the middle of the second reflector RF2 may be greater than a second inclination angle θ2 of an inclined surface formed at an edge of the second reflector RF2.

Thus, the inclined surface formed by the second protrusion P2 and the second valley GR2 of the second reflector RF2 may be the sharpest in the middle of the second reflector RF2. Further, the inclination angle may decrease (i.e., the inclined surface may be relatively slow) as it approaches the second and third solar cells CE2 and CE3 which are adjacent to each other in the second direction y.

Accordingly, in the first modified example shown in FIGS. 6A and 6B, because a reflection path of light incident on the middle of the first and second reflectors RF1 and RF2 is longer than a reflection path of light incident on the edges of the first and second reflectors RF1 and RF2, an amount of light incident on each solar cell may further increase.

So far, in the first embodiment of the invention, ends of the first and second protrusions P1 and P2 of the first and second reflectors RF1 and RF2 are positioned on the same plane as the front surface of the semiconductor substrate 110 of each solar cell, or are positioned below the front surface of the semiconductor substrate 110. On the contrary, the ends of the first and second protrusions P1 and P2 of the first and second reflectors RF1 and RF2 may further protrude from the surface formed by the semiconductor substrate 110 toward the front of the solar cell module.

This is described in detail below with reference to FIGS. 7A and 7B.

Figure 7A:
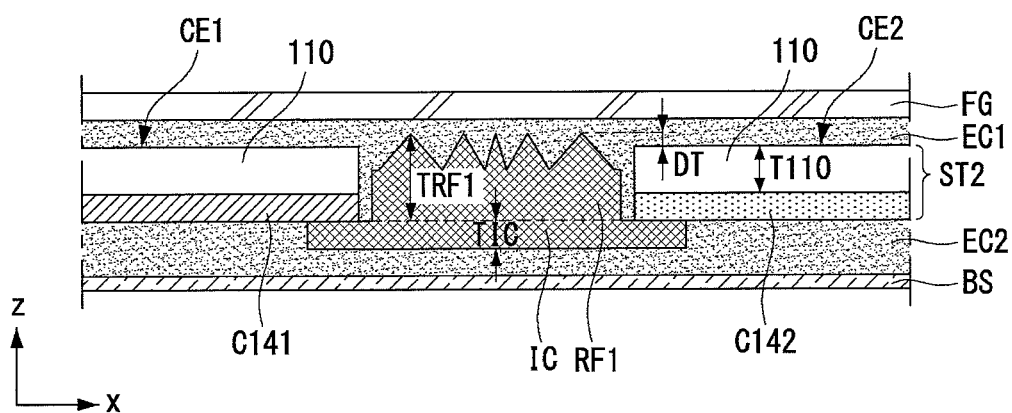
FIGS. 7A and 7B show a second modified example of first and second reflectors in the solar cell module according to the first embodiment of the invention.
Figure 7B:
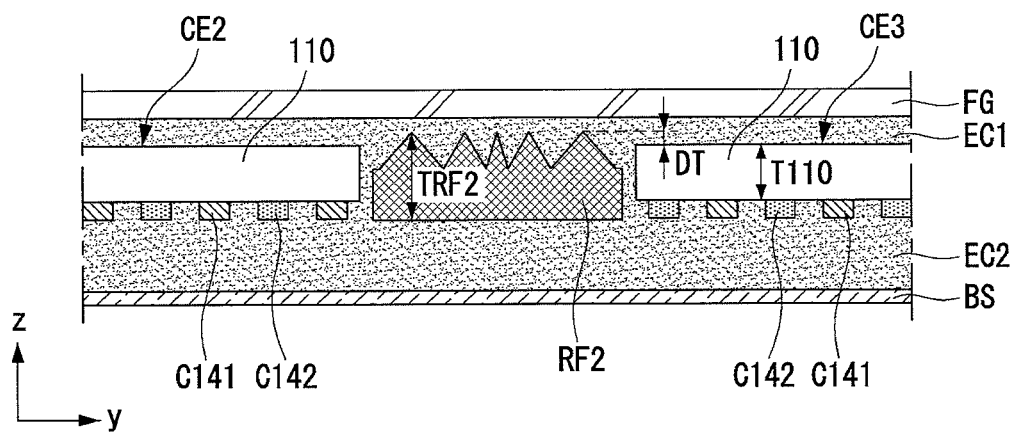

FIGS. 7A and 7B show a second modified example of the first and second reflectors in the solar cell module according to the first embodiment of the invention.

As shown in FIGS. 7A and 7B, in the solar cell module according to the embodiment of the invention, ends of the first and second protrusions P1 and P2 of the first and second reflectors RF1 and RF2 may further protrude from the surface formed by the semiconductor substrate 110 toward the front of the solar cell module by a distance DT.

In the embodiment disclosed herein, the distance DT is set to be less than a thickness of the first encapsulant EC1. For example, the distance DT may be 1/100 to 1/2 of the thickness of the first encapsulant EC1.

For this, as shown in FIG. 7A, a sum of a thickness TRF1 of the first reflector RF1 and a thickness TIC of the interconnector IC may be greater than a thickness T110 of the semiconductor substrate 110 of the solar cell.

Further, as shown in FIG. 7B, a thickness TRF2 of the second reflector RF2 may be greater than the thickness T110 of the semiconductor substrate 110 of the solar cell.

As described above, because the ends of the first and second protrusions P1 and P2 of the first and second reflectors RF1 and RF2 further protrude from the surface of the semiconductor substrate 110 toward the front of the solar cell module, light reflected from the first and second reflectors RF1 and RF2 may not be obstructed by the sides of the semiconductor substrate 110.

So far, in the first embodiment of the invention, the first and second reflectors RF1 and RF2 have the first and second protrusions P1 and P2 on their front surfaces. However, the first and second reflectors RF1 and RF2 may not have the first and second protrusions P1 and P2, and the front surfaces of the first and second reflectors RF1 and RF2 may be flat. This is described in detail below with reference to FIGS. 8A and 8B.

Figure 8A:
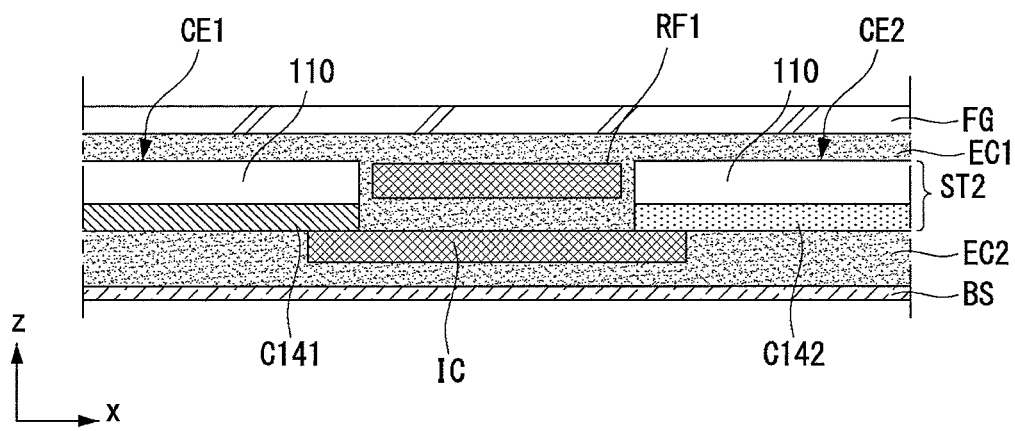
FIGS. 8A and 8B show a third modified example of first and second reflectors in the solar cell module according to the first embodiment of the invention.
Figure 8B:
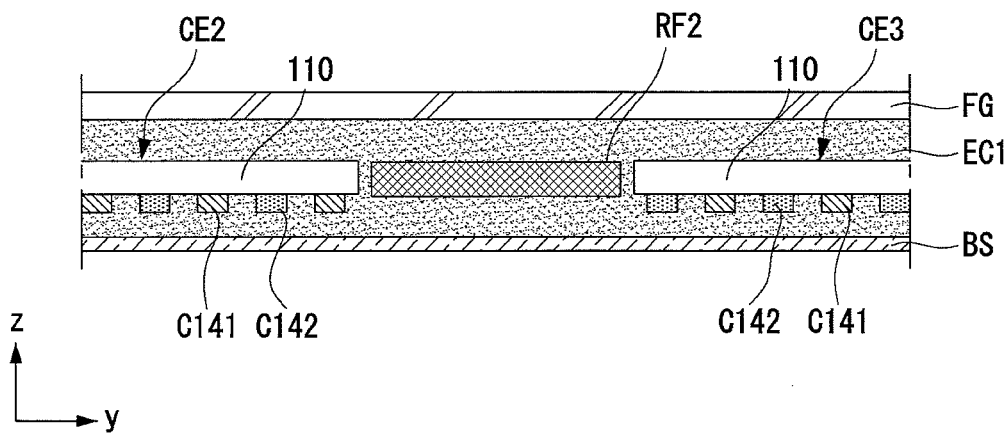

FIGS. 8A and 8B show a third modified example of the first and second reflectors in the solar cell module according to the first embodiment of the invention.

More specifically, FIG. 8A shows another example of a cross-sectional view taken along line X1-X1 of FIG. 1, and FIG. 8B shows another example of a cross-sectional view taken along line Y1-Y1 of FIG. 1.

The description of structures and components identical or equivalent to those illustrated in FIGS. 1 to 5 is omitted in FIGS. 8A and 8B, and a difference therebetween is mainly described.

As shown in FIGS. 8A and 8B, the front surfaces of the first and second reflectors RF1 and RF2 may have a flat surface not having the uneven portions. In this instance, a plane position of each of the first and second reflectors RF1 and RF2 may be substantially the same as the plane position illustrated in FIGS. 1 to 7B.

The first and second reflectors RF1 and RF2 shown in FIGS. 8A and 8B may contain an insulating material. For example, the first and second reflectors RF1 and RF2 may contain the insulating material, such as silicon oxide (SiOx) and titanium oxide (TiOx).

Refractive indexes of the first and second reflectors RF1 and RF2 may be different from a refractive index of the first encapsulant EC1, so as to improve a reflectance. For example, when the refractive index of the first encapsulant EC1 is 1.48, the refractive indexes of the first and second reflectors RF1 and RF2 may be less or greater than 1.48. For example, the refractive indexes of the first and second reflectors RF1 and RF2 may be 1.2 to 1.5 except 1.48.

The first and second reflectors RF1 and RF2 may contain a white-based material, for example, a white fluorescent substance, so as to further improve the reflectance.

As shown in FIG. 8A, the front surface of the first reflector RF1 may have a flat surface not having the plurality of uneven portions. Further, as shown in FIG. 8B, the front surface of the second reflector RF2 may have a flat surface not having the plurality of uneven portions.

FIG. 8A shows that the first reflector RF1 is separated from the semiconductor substrates 110 of the first and second solar cells CE1 and CE2. However, if the first reflector RF1 includes the insulating material as described above, the first reflector RF1 may not be spatially separated from the semiconductor substrates 110 of the first and second solar cells CE1 and CE2.

Further, FIG. 8B shows that the second reflector RF2 is separated from the semiconductor substrates 110 of the second and third solar cells CE2 and CE3. However, the second reflector RF2 may not be spatially separated from the semiconductor substrates 110 of the second and third solar cells CE2 and CE3.

The solar cell module according to the embodiment of the invention may use a back contact solar cell, in which the plurality of first and second electrodes C141 and C142 are formed on the back surface of the semiconductor substrate 110 to be separated from each other.

The first embodiment of the invention described that the first reflectors RF1 are separated from one another in the second direction y and extend, or the second reflectors RF2 are separated from one another in the first direction x and extend, as an example.

For example, the first embodiment of the invention described that the plurality of second reflectors RF2 are formed between the first string ST1 and the second string ST2 and are separated from one another in the first direction x, as an example. Further, the first embodiment of the invention described that the plurality of first reflectors RF1 are separated from one another in the second direction y, as an example.

However, the embodiment of the invention is not limited thereto and may variously vary. For example, the first and second reflectors RF1 and RF2 positioned on the same line may not be in the plural, and the number of one of the first and second reflectors RF1 and RF2 positioned on the same line may be one. This is described in detail below.

Figure 9:
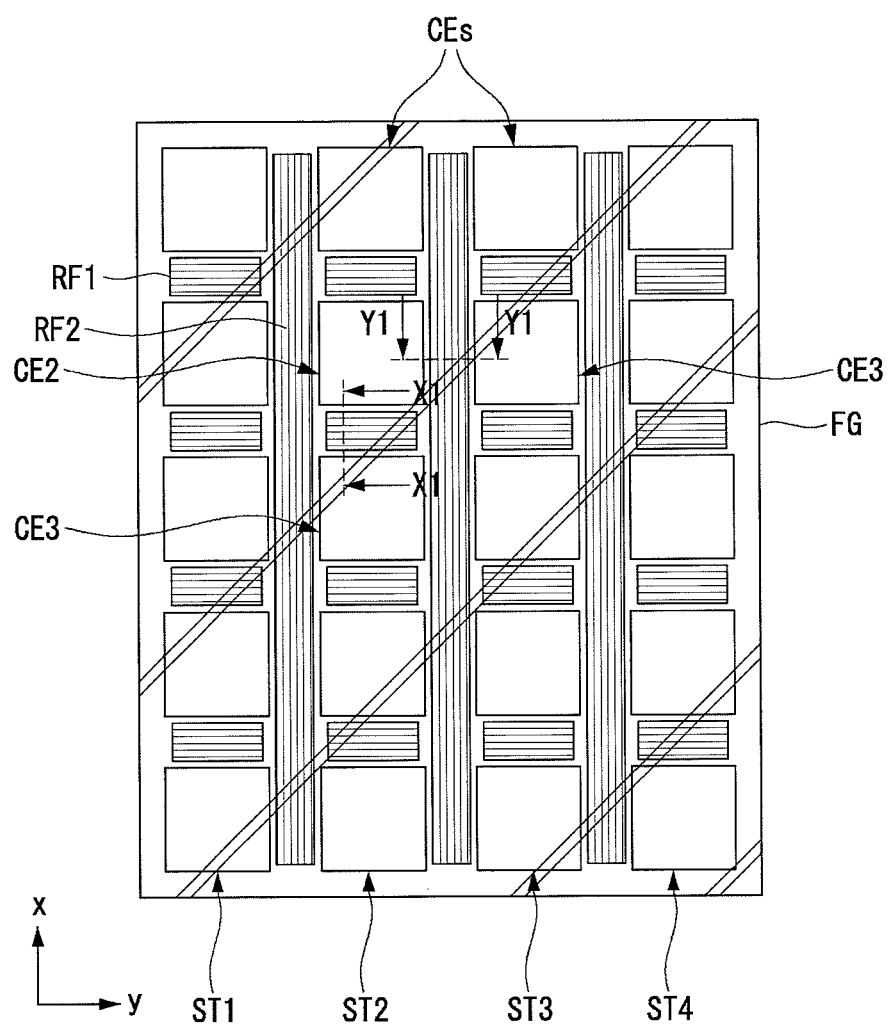
FIG. 9 illustrates a solar cell module according to a second embodiment of the invention.

FIG. 9 illustrates a solar cell module according to a second embodiment of the invention.

The description of structures and components identical or equivalent to those illustrated in the first embodiment of the invention is omitted in the second embodiment of the invention, and a difference therebetween is mainly described.

As shown in FIG. 9, a second reflector RF2, which is positioned between a plurality of strings ST1 to ST4 and extends in a first direction x, is not divided and may be formed in the form of one body. Namely, one second reflector RF2 may be positioned between the first string ST1 and the second string ST2.

As described above, in the second embodiment of the invention, because one second reflector RF2 is positioned between the two adjacent strings and extends in the first direction x, a non-formation space of the first and second reflectors RF1 and RF2 in a separation space between solar cells CEs decreases. Hence, an amount of light incident on each solar cell CEs according to the second embodiment of the invention may further increase, as compared with the solar cell module according to the first embodiment of the invention. Further, the manufacturing process may be further simplified.

FIG. 9 shows that the second reflector RF2 extends in the form of one body, as an example. On the contrary, the first reflector RF1 may be formed in the form of one body in a second direction y crossing a longitudinal direction (i.e., the first direction x) of each of the strings ST1 to ST4.

Further, both the first and second modified examples of the first and second reflectors RF1 and RF2 may be applied to the solar cell module according to the second embodiment of the invention.

FIG. 9 shows that the first reflector RF1 or the second reflector RF2 is not divided and is formed in the form of one body, so as to reflect light incident on a space between the four adjacent solar cells, as an example.

On the contrary, the solar cell module according to the embodiment of the invention may include a separate reflector having uneven portions, which are formed in the space between the four adjacent solar cells of FIG. 1 in an oblique direction of the first direction x and the second direction y.

This is described in detail below with reference to FIGS. 10A and 10B.

Figure 10A:
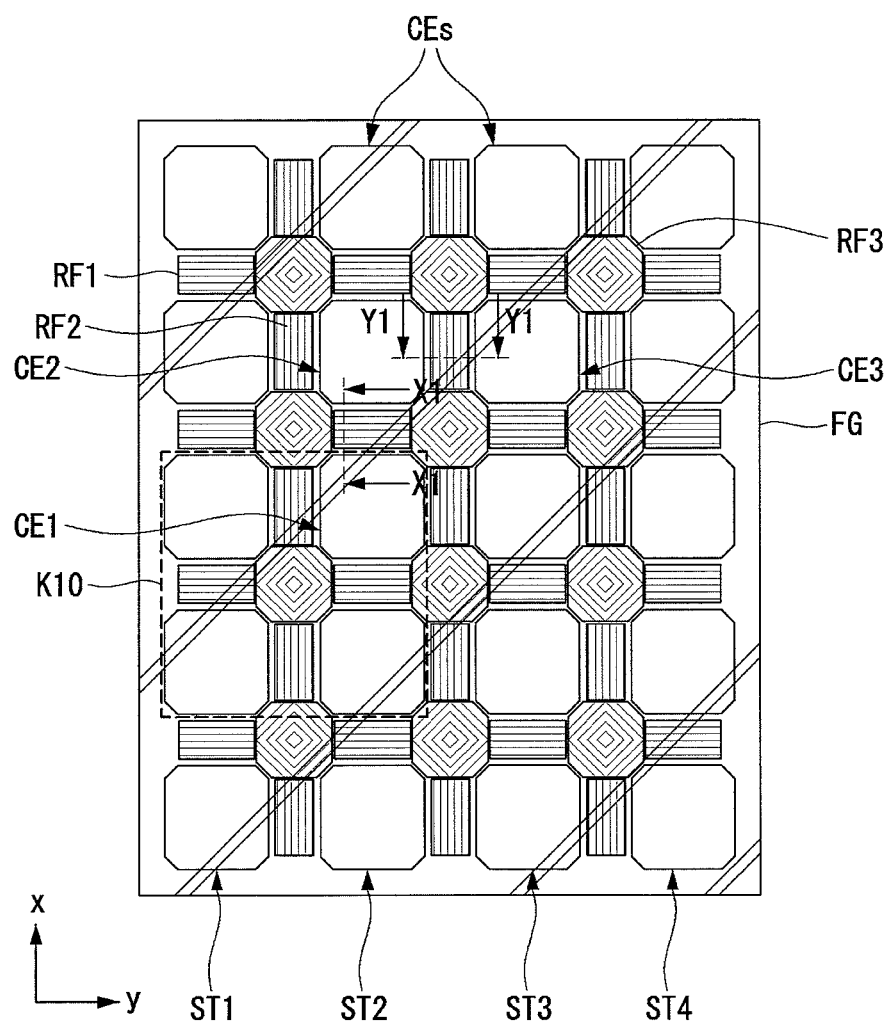
FIGS. 10A and 10B illustrate a solar cell module according to a third embodiment of the invention.
Figure 10B:
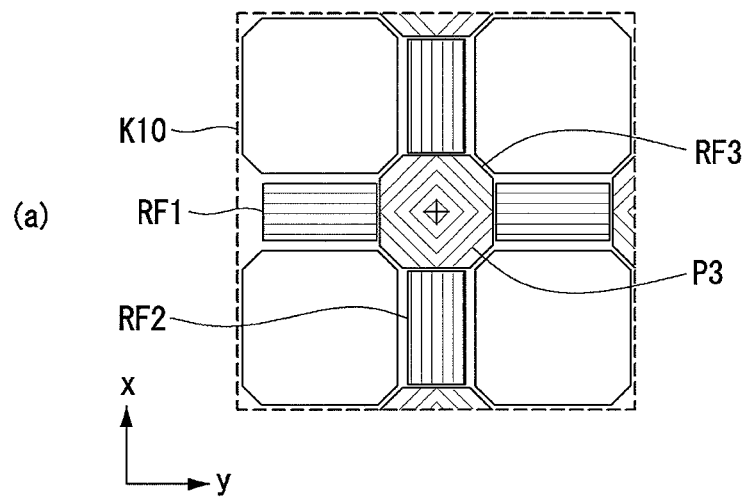
Figure 10B:
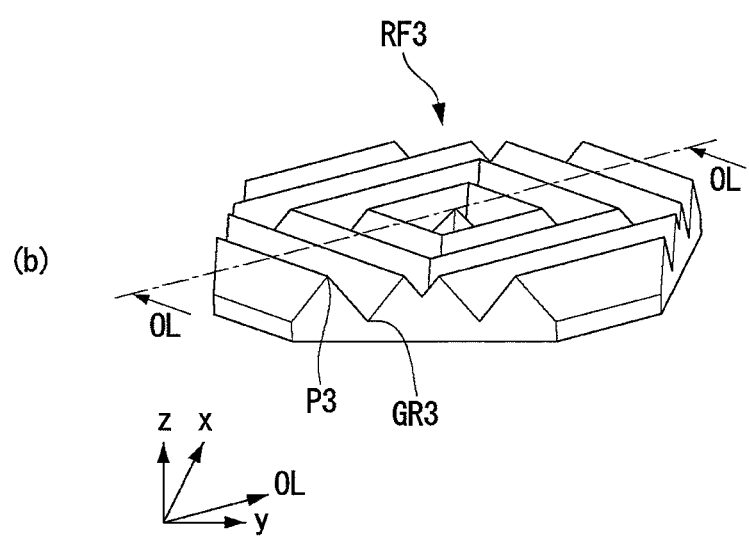
Figure 10B:
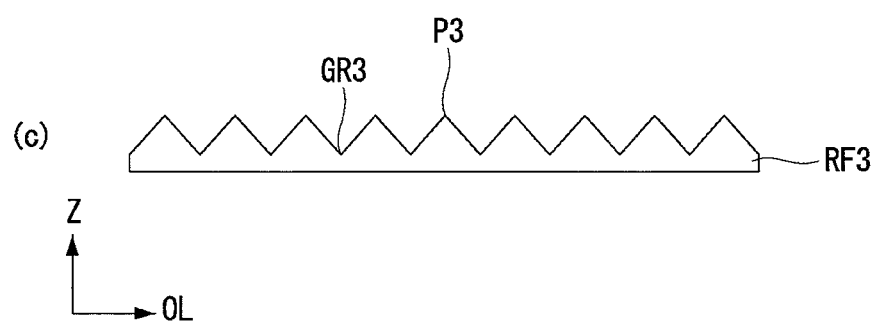

FIGS. 10A and 10B illustrate a solar cell module according to a third embodiment of the invention.

More specifically, FIG. 10A is a plane view of the solar cell module according to the third embodiment of the invention. In FIG. 10B, (a) is an enlarged view of a portion K10 of FIG. 10A, (b) is a perspective view of a third reflector, and (c) is a cross-sectional view taken along line OL-OL corresponding to an oblique direction OL of the third reflector in (b) of FIG. 10B.

The description of structures and components identical or equivalent to those illustrated in the first and second embodiments of the invention is omitted in the third embodiment of the invention, and a difference therebetween is mainly described.

As shown in FIGS. 10A and 10B, the solar cell module according to the third embodiment of the invention may include a third reflector RF3 in an adjacent space, in which four solar cells of FIG. 1 are adjacent to one another (i.e., an adjacent space of a first reflector RF1 and a second reflector RF2).

FIG. 1 shows the solar cells each having a rectangular shape, as an example. However, when the semiconductor substrate 110 included in each solar cell is formed of single crystal silicon, the semiconductor substrate 110 may have an octagon shape, in which four corners (or edges) of a rectangle have a line shape, as shown in FIG. 10A and (a) of FIG. 10B.

In the solar cell module according to the third embodiment of the invention, the third reflector RF3 may have an octagon shape in consideration of the shape of the edges of the semiconductor substrate 110.

Hence, because the shape of the third reflector RF3 corresponds to the shape of the edges of the semiconductor substrate 110 formed of single crystal silicon, a leakage portion of light may further decrease and a reflection area of light may further increase. As a result, the efficiency of the solar cell module may be further improved. In embodiments of the invention, the third reflection RF3 may have other shapes, such as a square, rectangle, circle, oval, triangle, polygon or irregular.

As shown in (a) to (c) of FIG. 10B, the third reflector RF3 may third protrusions P3 and third valleys GR3 on its front surface.

Thus, as shown in (a) and (b) of FIG. 10B, a plane shape of the third protrusions P3 and the third valleys GR3 formed on the front surface of the third reflector RF3 may have a diamond pattern.

More specifically, the third protrusion P3 and the third valley GR3 may extend in an oblique direction OL of first and second directions x and y. Thus, an inclined surface formed by the third protrusion P3 and the third valley GR3 may be formed toward the oblique direction OL of the first and second directions x and y or a direction vertical to the oblique direction OL.

Hence, light reflected from uneven portions formed on the front surface of the third reflector RF3 may be incident on the four solar cells positioned in the oblique direction of the third reflector RF3. As a result, the efficiency of the solar cell module may be further improved.

The third embodiment of the invention described the solar cell module separately including the third reflector RF3 in addition to the first and second reflectors RF1 and RF2. However, the third reflector RF3 may form one body along with the first reflector RF1 or the second reflector RF2.

So far, the embodiments of the invention described that the reflector is positioned between the two adjacent solar cells belonging to the same string or between the two adjacent strings, as an example. However, the reflector may be positioned on an outer surface of an outermost string or an outer surface of an outermost solar cell.

This is described in detail below with reference to FIG. 11.

Figure 11:
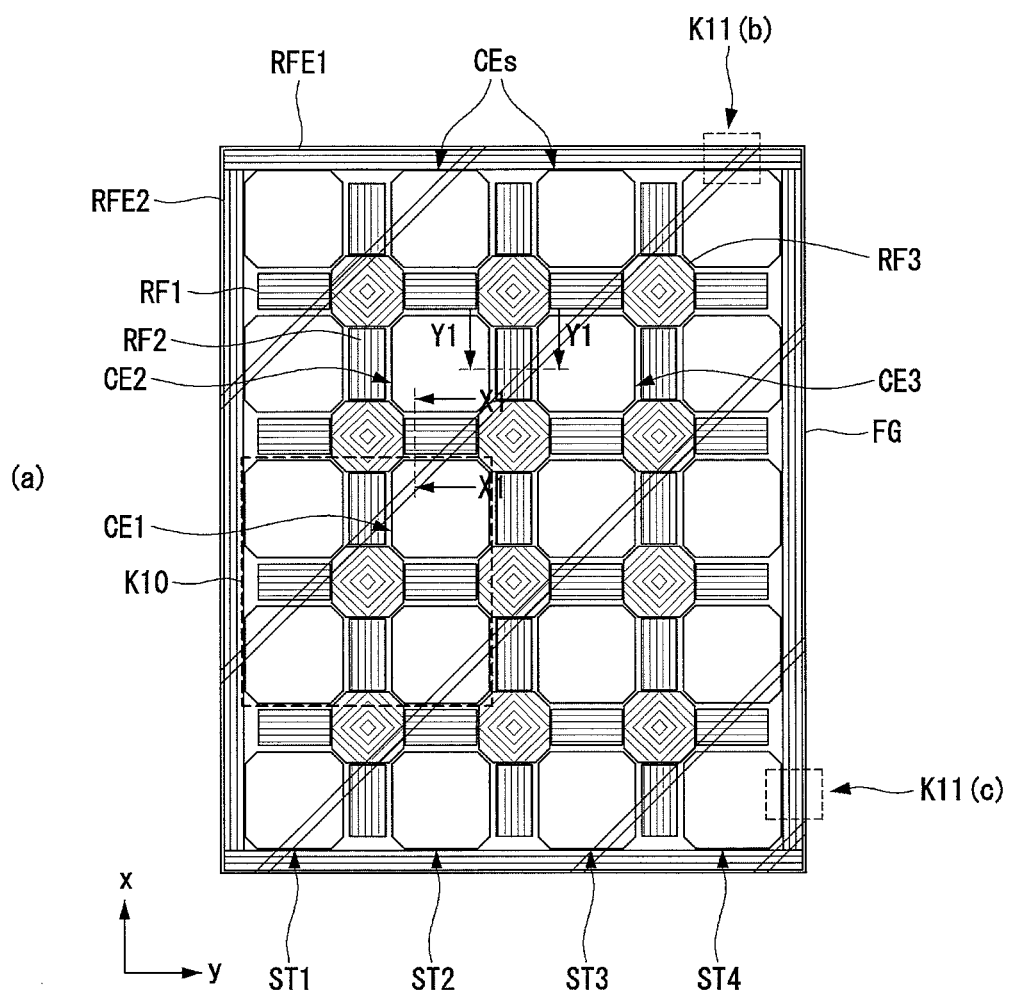
FIG. 11 illustrates a solar cell module according to a fourth embodiment of the invention.
Figure 11:
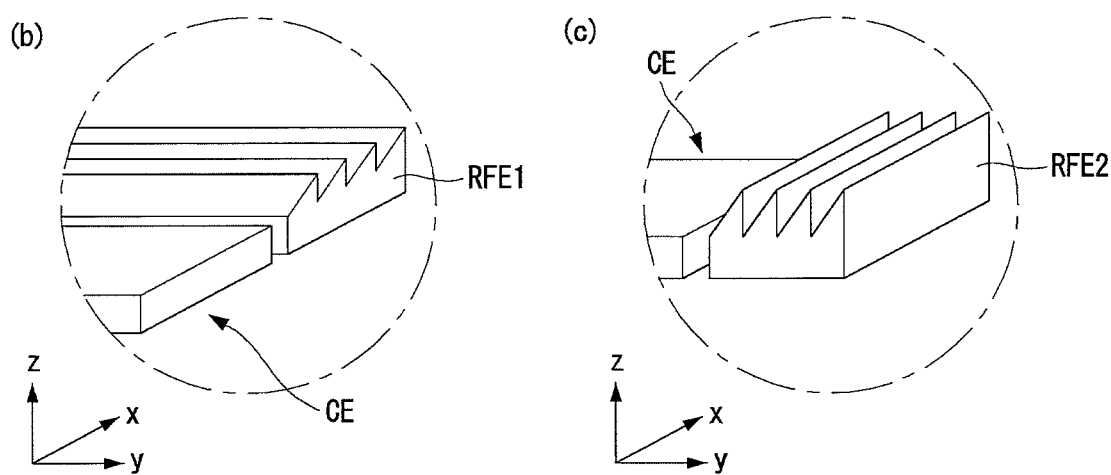

FIG. 11 illustrates a solar cell module according to a fourth embodiment of the invention.

More specifically, in FIG. 11, (a) is a plane view of the solar cell module according to the fourth embodiment of the invention, (b) is an enlarged perspective view of a portion K11(b) of (a) of FIG. 11, and (c) is an enlarged perspective view of a portion K11(c) of (a) of FIG. 11.

The description of structures and components identical or equivalent to those illustrated in the first to third embodiments of the invention is omitted in the fourth embodiment of the invention, and a difference therebetween is mainly described.

As shown in (a) of FIG. 11, the solar cell module according to the fourth embodiment of the invention may further include outermost reflectors RFE1 and RFE2, which are positioned outside (i.e., an outer surface of an outermost string or an outer surface of an outermost solar cell) a plurality of solar cells when viewing the solar cell module from its front surface.

The outermost reflectors RFE1 and RFE2 may include first outermost reflectors RFE1 positioned on the upper and lower sides of the solar cell module and second outermost reflectors RFE2 positioned on the left and right sides of the solar cell module.

The first outermost reflectors RFE1 may be positioned on outer surfaces of outermost solar cells (in the upper and lower direction) included in each string of the solar cell module, and the second outermost reflectors RFE2 may be positioned on outer surfaces of solar cells (in the left and right direction) included in left and right outermost strings of the solar cell module.

Each of the first and second outermost reflectors RFE1 and RFE2 may have a plurality of uneven portions. An inclined surface formed by the plurality of uneven portions may face only the plurality of solar cells positioned inside the first and second outermost reflectors RFE1 and RFE2.

Namely, as shown in (b) of FIG. 11, an inclined surface formed by the plurality of uneven portions included in the first outermost reflectors RFE1 positioned on the upper and lower sides of the solar cell module may face toward the first direction x corresponding to the upper and lower direction of the solar cell module.

Further, as shown in (c) of FIG. 11, an inclined surface formed by the plurality of uneven portions included in the second outermost reflectors RFE2 positioned on the left and right sides of the solar cell module may face toward the second direction y corresponding to the left and right direction of the solar cell module.

As described above, the solar cell module according to the fourth embodiment of the invention includes the outermost reflectors RFE1 and RFE2 at edges of the solar cell module and forms the uneven portions of the outermost reflectors RFE1 and RFE2, in which the inclined surfaces of the outermost reflectors RFE1 and RFE2 face the inner surface of the solar cell module, thereby further improving the efficiency of the solar cell module.

Figure 12:
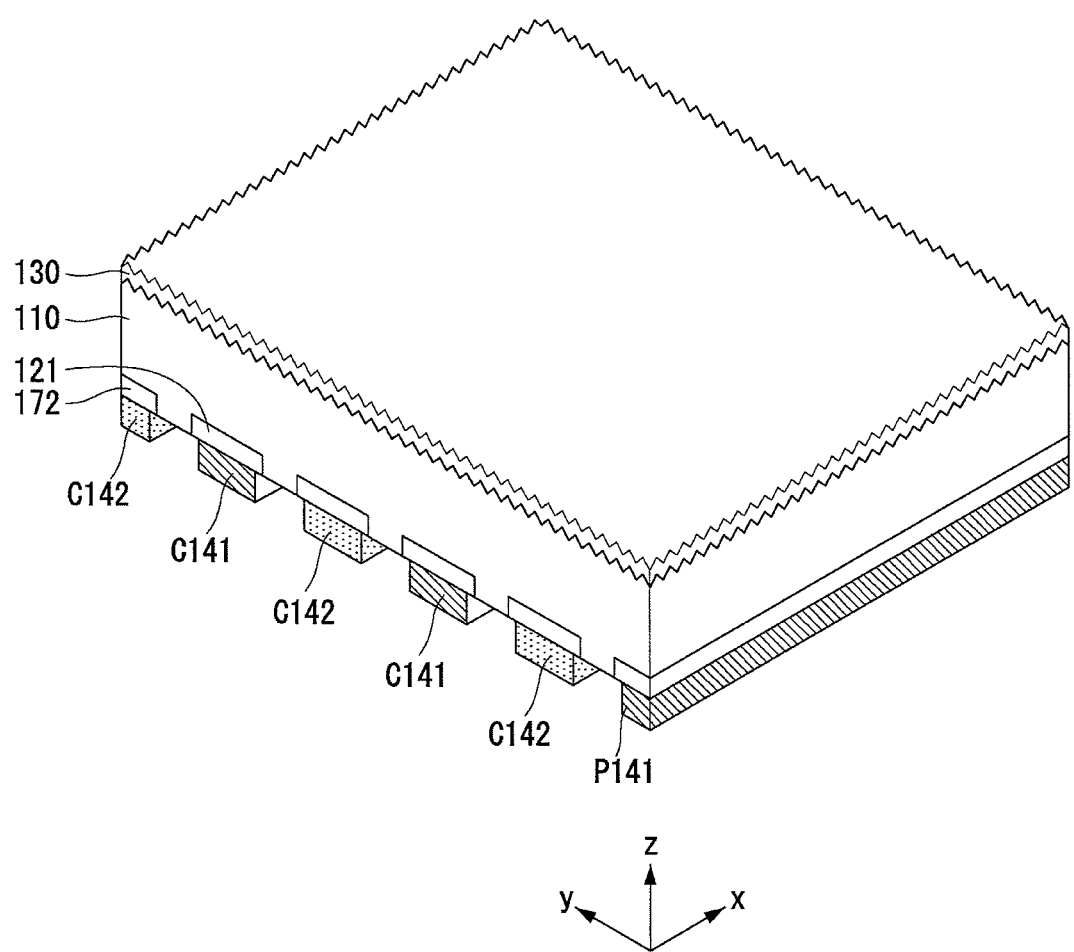
FIGS. 12 and 13 show an example of a solar cell applicable to the solar cell modules shown in FIGS. 1 to 9B.
Figure 13:
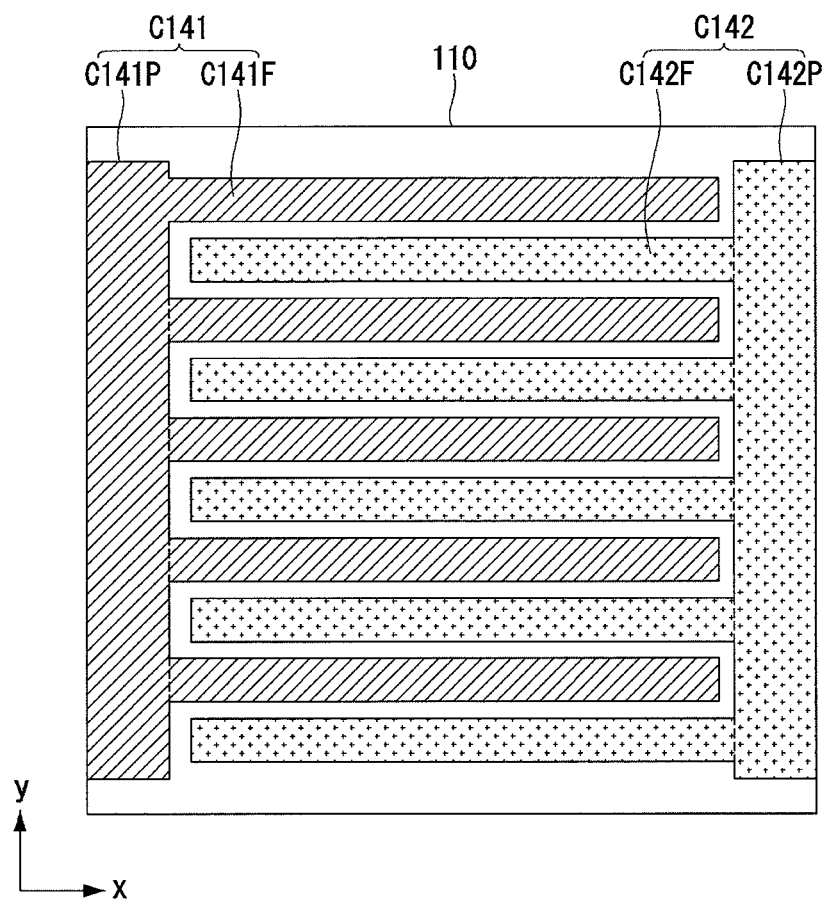

FIGS. 12 and 13 show an example of a solar cell applicable to the solar cell modules according to the first to third embodiments of the invention.

More specifically, FIG. 12 is a partial perspective view of a solar cell, and FIG. 13 shows an example of a pattern of first and second electrodes formed on a back surface of the solar cell shown in FIG. 12.

As shown in FIG. 12, an example of the solar cell according to the embodiment of the invention may include a semiconductor substrate 110, an anti-reflection layer 130, an emitter region 121, a plurality of back surface field (BSF) regions 172, a plurality of first electrode C141, and a plurality of second electrodes 142.

The anti-reflection layer 130 and the back surface field region 172 may be omitted, if necessary or desired. In the following description, the embodiment of the invention described the solar cell including the anti-reflection layer 130 and the back surface field region 172 as shown in FIG. 12, as an example.

The semiconductor substrate 110 may be a semiconductor substrate formed of silicon of a first conductive type, for example, an n-type, though not required. The semiconductor substrate 110 may be formed by doping a wafer formed of silicon material with impurities of the first conductive type.

The emitter region 121 may be positioned to be separated from one another inside a back surface opposite a front surface of the semiconductor substrate 110 and may extend in a direction parallel to one another. Namely, the emitter region 121 may be in the plural. The plurality of emitter regions 121 may contain impurities of a second conductive type (for example, p-type) opposite the first conductive type (for example, n-type) of the semiconductor substrate 110. Thus, the emitter region 121 may form a p-n junction along with the semiconductor substrate 110.

The plurality of back surface field regions 172 may be positioned inside the back surface of the semiconductor substrate 110. The plurality of back surface field regions 172 may be positioned to be separated from one another in a direction parallel to the plurality of emitter regions 121 and may extend in the same direction as the emitter regions 121. Thus, as shown in FIGS. 12 and 13, the plurality of emitter regions 121 and the plurality of back surface field regions 172 may be alternately positioned at the back surface of the semiconductor substrate 110.

Each back surface field region 172 may be a region (for example, an $n^{++}$-type region) which is more heavily doped than the semiconductor substrate 110 with impurities of the same conductive type as the semiconductor substrate 110.

The plurality of first electrodes C141 may be physically and electrically connected to the plurality of emitter regions 121, respectively, and may be formed on the back surface of the semiconductor substrate 110 along the emitter regions 121.

As shown in FIG. 13, the first electrodes C141 may include a plurality of first finger electrodes C141F and a first electrode pad C141P.

The plurality of first finger electrodes C141F may be separated from one another along the plurality of emitter regions 121 on the back surface of the semiconductor substrate 110. Thus, when the plurality of emitter regions 121 are arranged along the first direction x, the first finger electrodes C141F may be arranged along the first direction x. Further, when the plurality of emitter regions 121 are arranged along the second direction y, the first finger electrodes C141F may be arranged along the second direction y.

The first electrode pad C141P is formed at an end of the back surface of the semiconductor substrate 110 in the second direction y crossing the plurality of first finger electrodes C141F. Hence, one side of the first electrode pad C141P may be commonly connected to the plurality of first finger electrodes C141F, and the other side may be connected to the interconnector IC.

Further, the plurality of second electrodes C142 may be physically and electrically connected to the semiconductor substrate 110 through the plurality of back surface field regions 172 and may be formed on the back surface of the semiconductor substrate 110 along the plurality of back surface field regions 172.

The first electrodes C141 and the second electrodes C142 are physically separated from each other and are electrically insulated from each other on the back surface of the semiconductor substrate 110.

The second electrodes C142 may include a plurality of second finger electrodes C142F and a second electrode pad C142P.

The plurality of second finger electrodes C142F may be separated from one another along the plurality of back surface field regions 172 on the back surface of the semiconductor substrate 110. Thus, when the plurality of back surface field regions 172 are arranged along the first direction x, the second finger electrodes C142F may be arranged along the first direction x and separated from the first electrodes C141. Further, when the plurality of back surface field regions 172 are arranged along the second direction y, the second finger electrodes C142F may be arranged along the second direction y and separated from the first electrodes C141.

The second electrode pad C142P is formed at an end of the back surface of the semiconductor substrate 110 in the second direction y crossing the plurality of second finger electrodes C142F. Hence, one side of the second electrode pad C142P may be commonly connected to the plurality of second finger electrodes C142F, and the other side may be connected to the interconnector IC.

In the solar cell having the above-described structure according to the embodiment of the invention, holes collected by the first electrodes C141 and electrons collected by the second electrodes C142 may be used as electric power of an external device through an external circuit device.

The plurality of solar cells CEs each having the above-described structure may be connected in series in the first direction x through the interconnector IC connected to the first electrode pad C141P or the second electrode pad C142P included in the solar cell as shown in FIG. 13.

FIGS. 12 and 13 show that both the emitter regions 121 and the back surface field regions 172 are formed at the back surface of the semiconductor substrate 110, as an example. On the contrary, the emitter regions 121 may be formed at the front surface of the semiconductor substrate 110 and may be connected to the first electrodes C141 formed on the back surface of the semiconductor substrate 110 through a hole formed in the semiconductor substrate 110.

The emitter region 121 and the back surface field region 172 may be formed by diffusing impurities through a thermal method. Alternatively, the emitter region 121 and the back surface field region 172 may be formed through a deposition method. Namely, the emitter region 121 and the back surface field region 172 may be formed through various methods.

So far, the embodiments of the invention described the solar cell not having a separate conductive line, as an example. On the contrary, in the solar cell module according to the embodiment of the invention, the solar cell may further include a conductive line on the back surface of the semiconductor substrate 110. Hereinafter, the solar cell module, in which the conductive line is further formed on the back surface of the semiconductor substrate 110, is described.

Figure 14A:
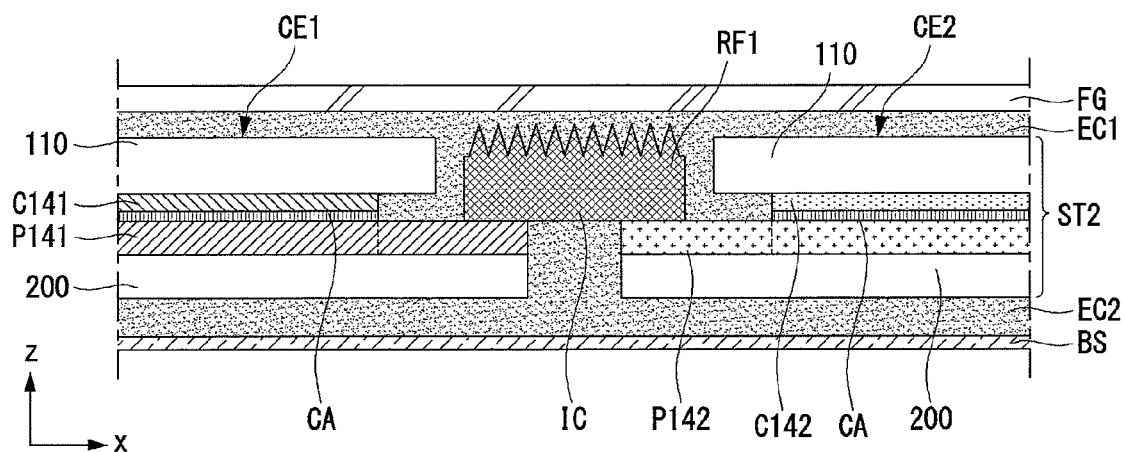
FIGS. 14A and 14B illustrate a solar cell module according to a fifth embodiment of the invention.
Figure 14B:
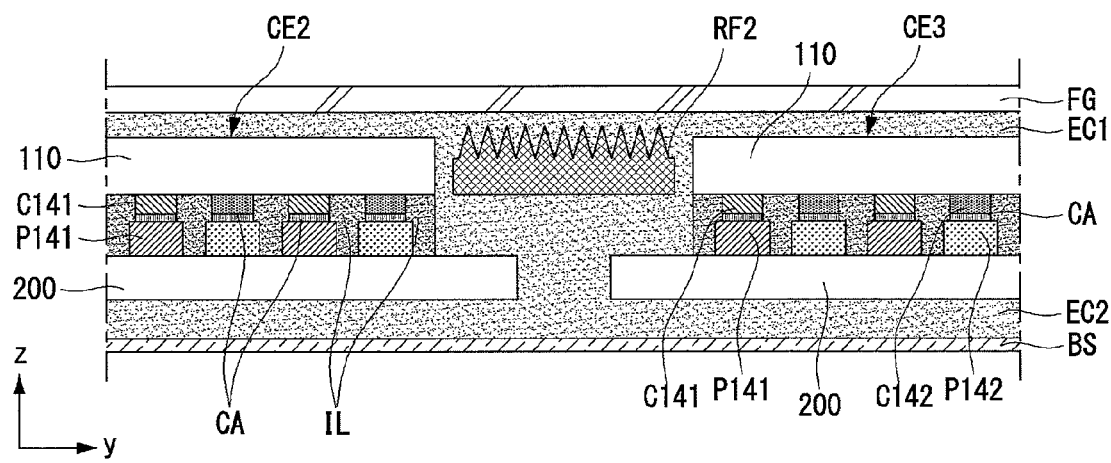

FIGS. 14A and 14B illustrate a solar cell module according to a fifth embodiment of the invention.

More specifically, FIG. 14A shows another example of a cross-sectional view taken along line X1-X1 of FIG. 1, and FIG. 14B shows another example of a cross-sectional view taken along line Y1-Y1 of FIG. 1.

The description of structures and components identical or equivalent to those illustrated in the first to fourth embodiments of the invention is omitted in the fifth embodiment of the invention, and a difference therebetween is mainly described.

Further, the description of the first to fourth embodiments of the invention may be repeatedly applied to the fifth embodiment of the invention.

As shown in FIGS. 14A and 14B, a solar cell applicable to the solar cell module according to the embodiment of the invention may further include first and second conductive lines P141 and P142 respectively connected to first and second electrodes C141 and C142 formed on a back surface of a semiconductor substrate 110. The first and second conductive lines P141 and P142 may be formed on a front surface of an insulating member 200.

In each solar cell according to the embodiment of the invention, an individual solar cell element may be formed by connecting the front surface of the insulating member 200, on which the first and second conductive lines P141 and P142 are formed to be separated from each other, to the back surface of the semiconductor substrate 110, on which the plurality of first and second electrodes C141 and C142 are formed to be separated from each other.

As shown in FIG. 14A, an end of the insulating member 200 in the first direction x and ends of the first and second conductive lines P141 and P142 in the first direction x may protrude further than an end of the semiconductor substrate 110 in the first direction x. Further, as shown in FIG. 14B, an end of the insulating member 200 in the second direction y may protrude further than an end of the semiconductor substrate 110 in the second direction y.

The structure of the above-described solar cell is described in detail below with reference to FIG. 15.

When the individual solar cell element is formed by connecting the insulating member 200 to the back surface of the semiconductor substrate 110 as described above, an interconnector IC may be connected to the first conductive line P141 or the second conductive line P142.

For example, as shown in FIG. 14A, the interconnector IC may connect a front surface of a first conductive line P141 of a first solar cell CE1 to a front surface of a second conductive line P142 of a second solar cell CE2.

The fifth embodiment of the invention described that the first and second conductive lines P141 and P142 are formed on the front surface of the insulating member 200, as an example. However, the insulating member 200 may be omitted.

For example, as shown in FIG. 14A, a first reflector RF1 may form one body along with the interconnector IC. Alternatively, as shown in FIG. 2B, the first reflector RF1 may be separated from the front surface of the interconnector IC, unlike FIG. 14A.

When the first reflector RF1 forms one body along with the front surface of the interconnector IC, a sum of a thickness of the first reflector RF1 and a thickness of the interconnector IC may be substantially the same as or different from a thickness of each of the first and second conductive lines P141 and P142.

For example, the thickness of each of the first and second conductive lines P141 and P142 may be 20 μm to 700 μm, and the sum of the thickness of the first reflector RF1 and the thickness of the interconnector IC may be 35 μm to 1 mm.

The sum of the thickness of the first reflector RF1 and the thickness of the interconnector IC may be substantially the same as or different from the thickness of each of the first and second conductive lines P141 and P142 within the above thickness range.

Further, a value obtained by adding the thickness of the first conductive line P141 or the thickness of the second conductive line P142 to the sum of the thickness of the first reflector RF1 and the thickness of the interconnector IC may be greater than a thickness of the semiconductor substrate 110.

For example, when the thickness of the semiconductor substrate 110 is 200 μm, the value obtained by adding the thickness of the first conductive line P141 or the thickness of the second conductive line P142 to the sum of the thickness of the first reflector RF1 and the thickness of the interconnector IC may be greater than 200 μm.

First protrusions P1 of an uneven surface formed at a front surface of the first reflector RF1 thus formed may pass the surface of the semiconductor substrate 110 and may further protrude toward the front of the solar cell module.

Thus, light reflected from the first reflector RF1 may be prevented from being blocked by the side of the semiconductor substrate 110, and an amount of light incident on the front surface of the semiconductor substrate 110 may further increase.

Further, a material of the interconnector IC may be the same as or different from a material of the first and second conductive lines P141 and P142.

For example, the interconnector IC may include a coating layer formed by coating a core formed of one of copper (Cu), aluminum (Al), and silver (Ag) with tin (Sn)-based metal, for example, SnBi, SnIn, or SnPb.

Further, each of the first and second conductive lines P141 and P142 may include a coating layer formed by coating a core formed of one of copper (Cu) and aluminum (Al) with tin (Sn)-based metal, for example, SnBi, SnIn, or SnPb.

In the embodiment disclosed herein, the core of the interconnector IC may be substantially the same as or different from the cores of the first and second conductive lines P141 and P142, and the coating layer of the interconnector IC may be substantially the same as or different from the coating layers of the first and second conductive lines P141 and P142.

In this instance, as shown in FIG. 14A, the first reflector RF1 is positioned between the semiconductor substrates 110 of the first and second solar cells CE1 and CE2. The first reflector RF1 may overlap the end of the insulating member 200 protruding further than the end of the semiconductor substrate 110 or the ends of the first and second conductive lines P141 and P142.

As shown in FIG. 14B, a second reflector RF2 is positioned between semiconductor substrates 110 of second and third solar cells CE2 and CE3. The second reflector RF2 may overlap an end of the insulating member 200 exposed to the outside of the semiconductor substrate 110 in the second direction y.

FIG. 14B shows that the second reflector RF2 is separated from the insulating member 200, as an example. On the contrary, the second reflector RF2 may not be separated from the insulating member 200.

Further, the first to fourth embodiments of the invention, the first to third modified examples, and a combination thereof may be applied to the first and second reflectors RF1 and RF2 of the solar cell module according to the fifth embodiment of the invention.

An example of a solar cell applicable to the solar cell module shown in FIGS. 14A and 14B is described below.

FIGS. 15 to 19C show an example of a solar cell applicable to the solar cell module according to the fifth embodiment of the invention.

Figure 15:
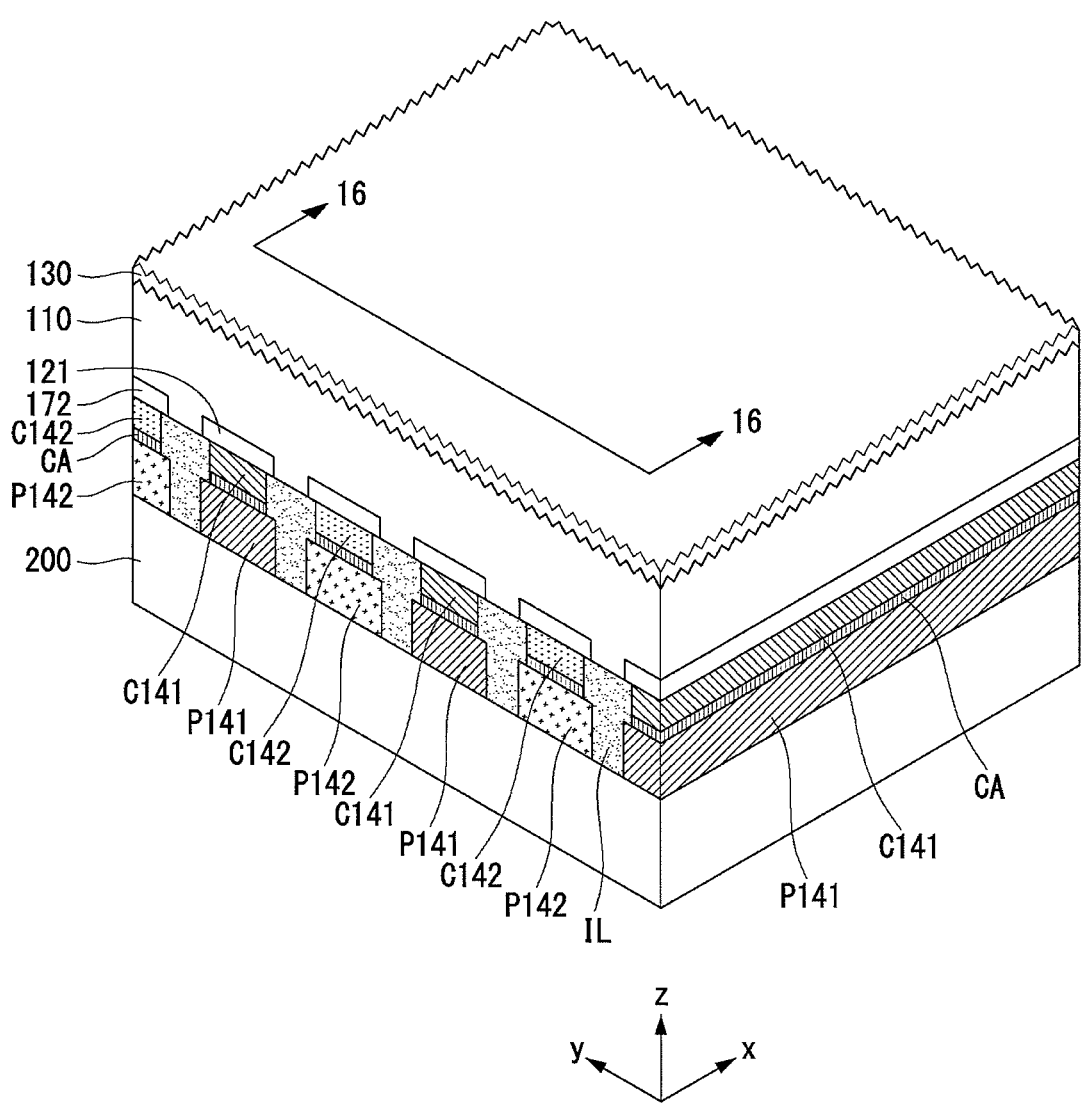
FIGS. 15 to 19C show an example of a solar cell applicable to the solar cell module according to the fifth embodiment of the invention.
Figure 16:
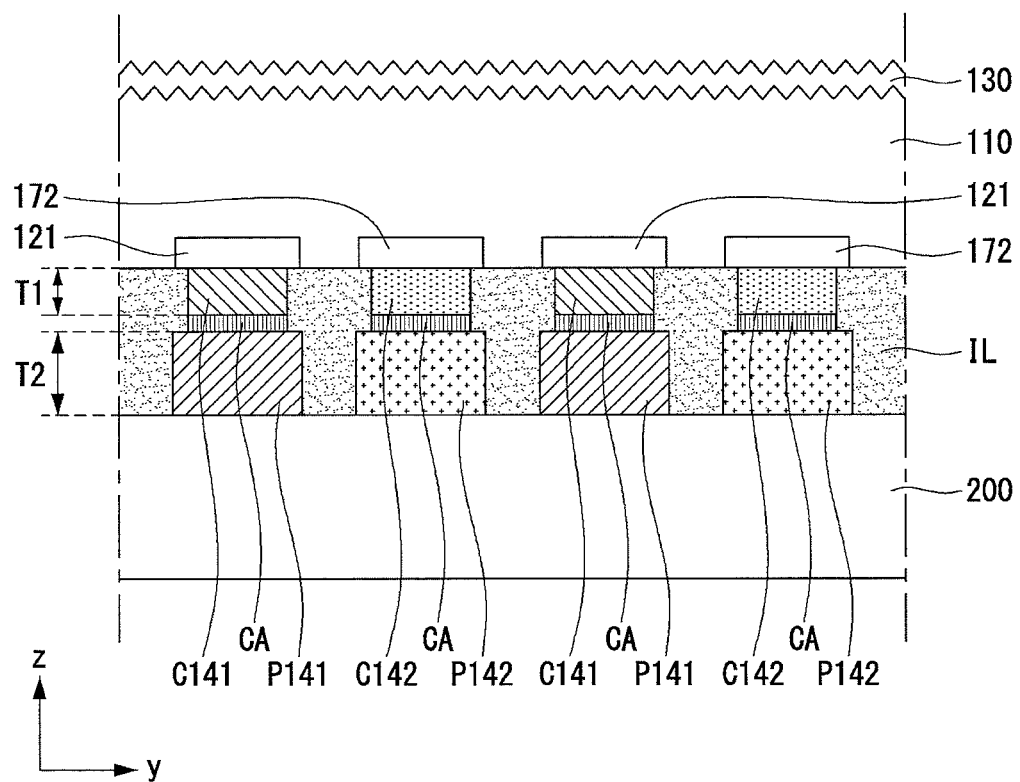
Figure 17:
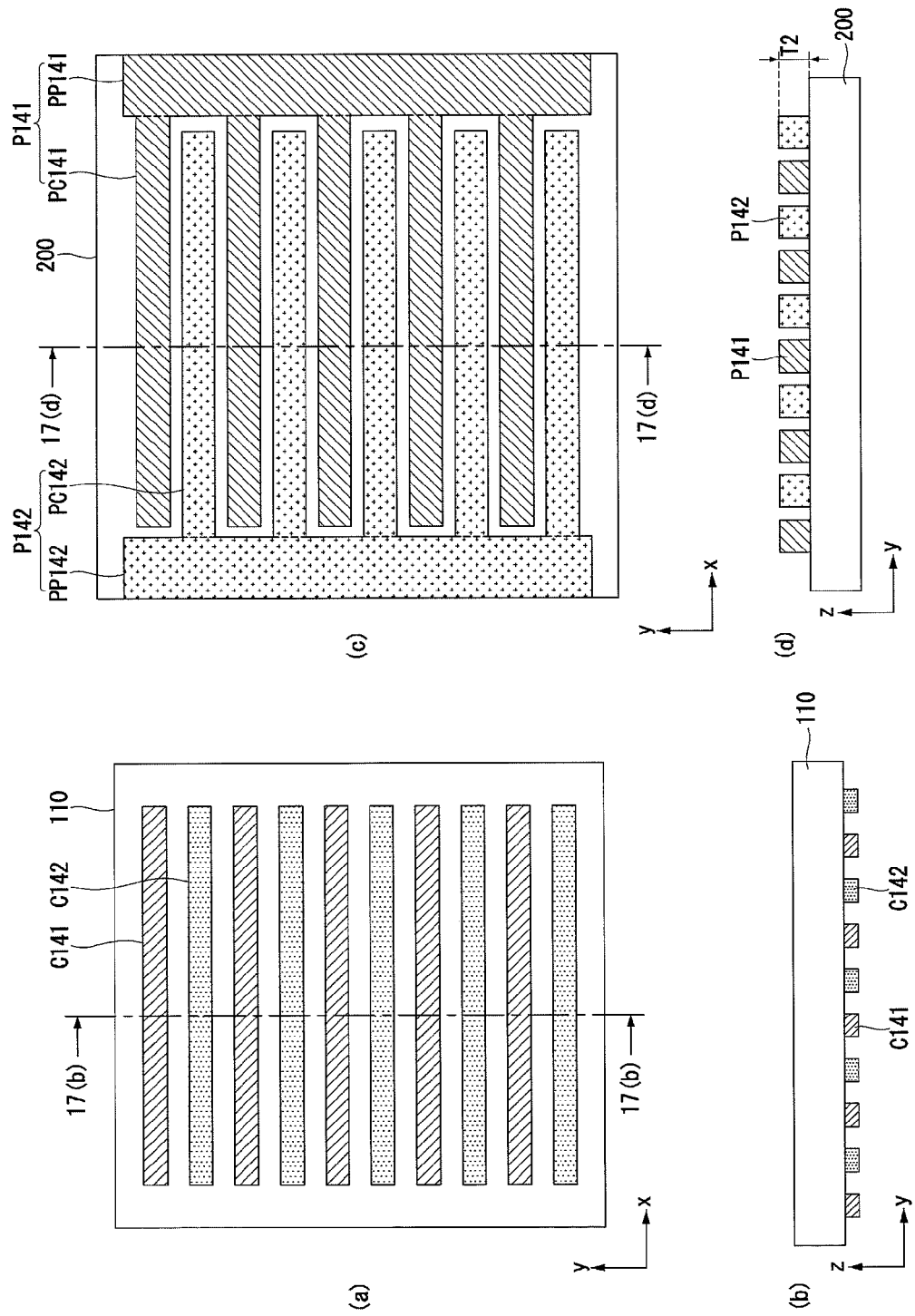

More specifically, FIG. 15 is a partial perspective view of a solar cell according to the embodiment of the invention, FIG. 16 is a cross-sectional view taken along line 16-16 of FIG. 15, and FIG. 17 shows an example of an electrode pattern of each of the semiconductor substrate 110 and the insulating member 200, which will be individually connected to each other in the solar cell shown in FIGS. 15 and 16.

In FIG. 17, (a) shows an example of a pattern of the first and second electrodes C141 and C142 disposed on the back surface of the semiconductor substrate 110; (b) is a cross-sectional view taken along line 17(b)-17(b) of (a) of FIG. 17; (c) shows an example of a pattern of the first and second conductive lines P141 and P142 disposed on the front surface of the insulating member 200; and (d) is a cross-sectional view taken along line 17(d)-17(d) of (c) of FIG. 17.

Figure 18:
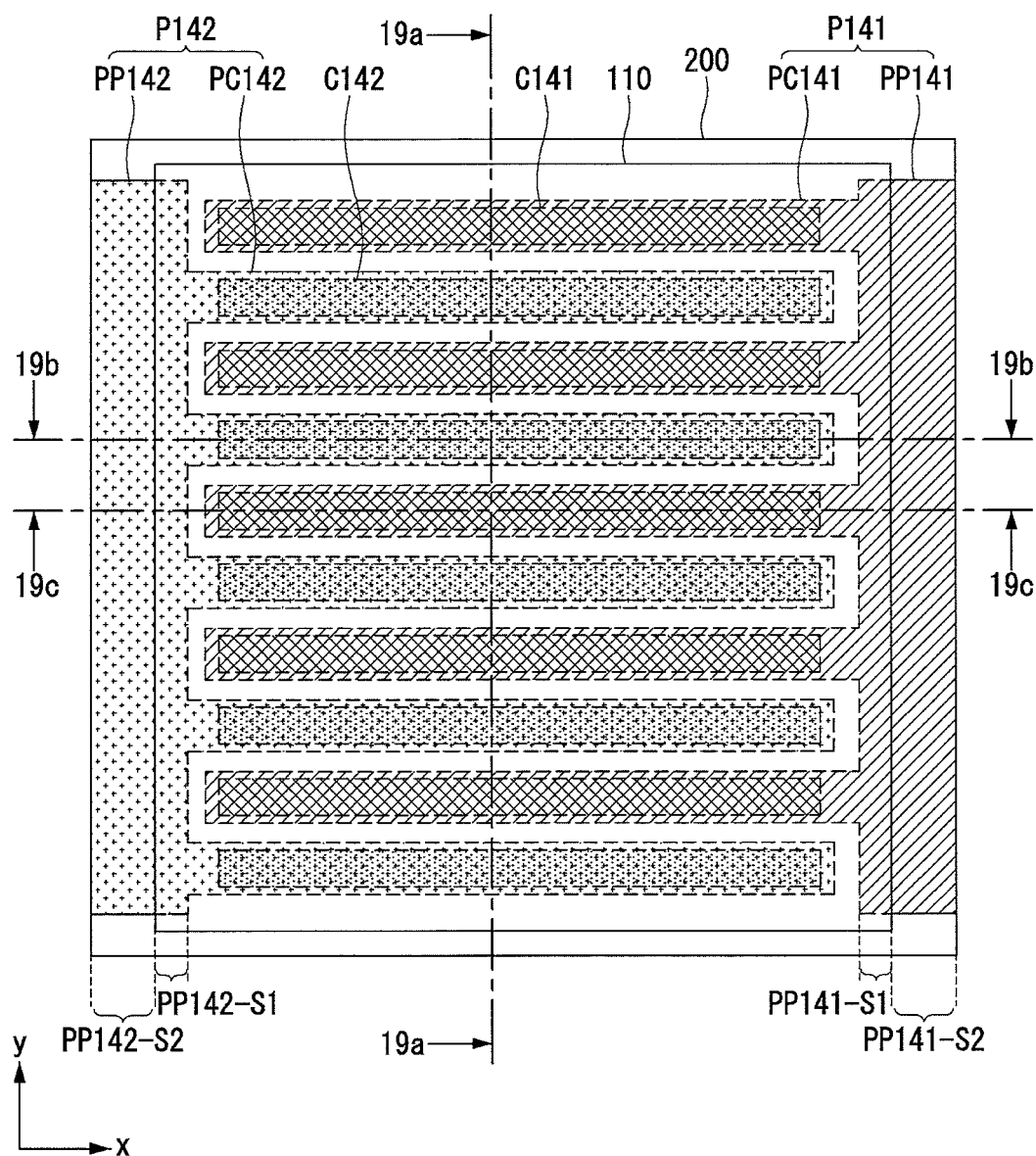
Figure 19A:
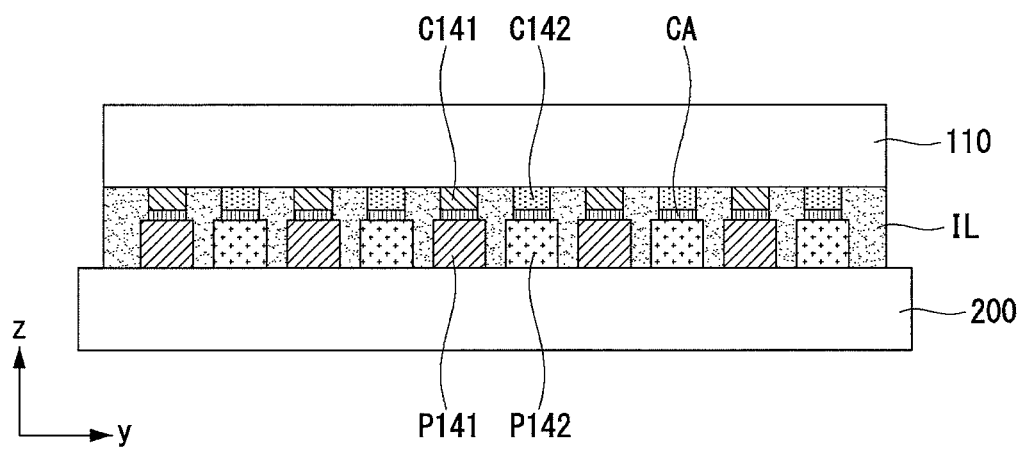
Figure 19B:
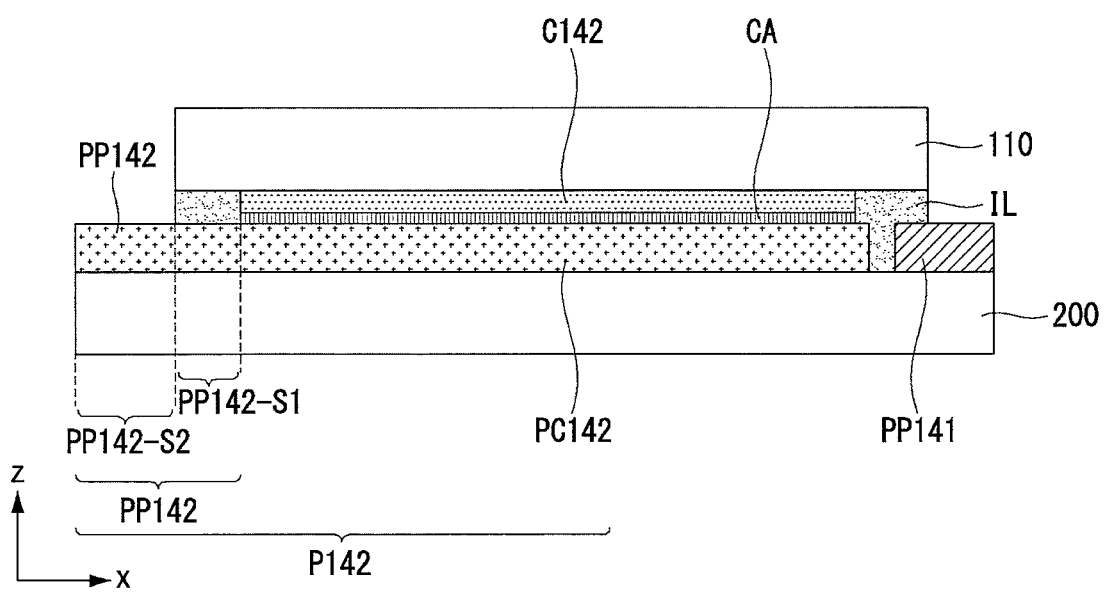
Figure 19C:
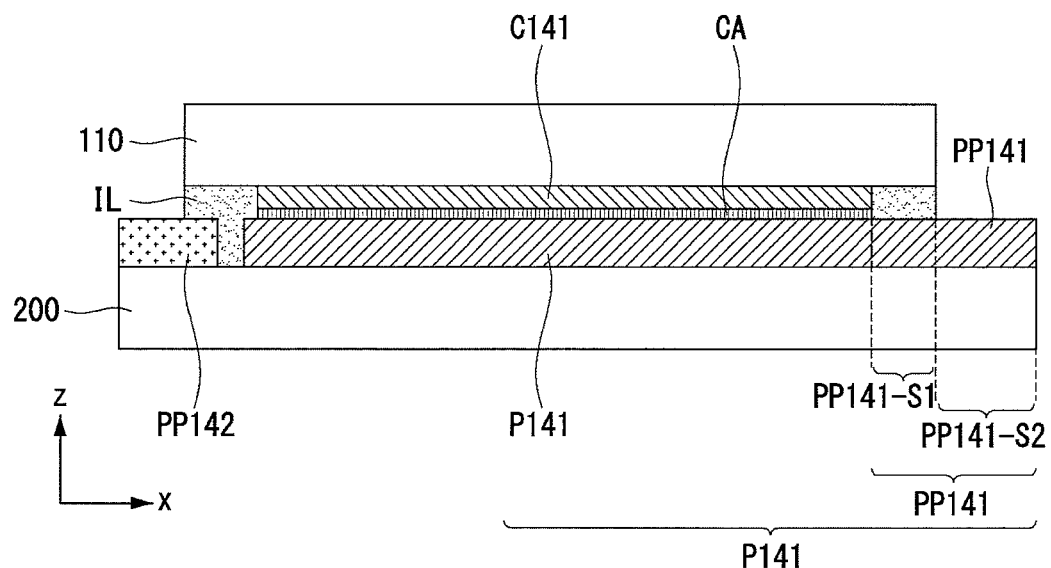

Further, FIG. 18 shows a state where the semiconductor substrate 110 and the insulating member 200 shown in FIG. 17 are connected to each other. FIG. 19A is a cross-sectional view taken along line 19a-19a of FIG. 18; FIG. 19B is a cross-sectional view taken along line 19b-19b of FIG. 18; and FIG. 19C is a cross-sectional view taken along line 19c-19c of FIG. 18.

As shown in FIGS. 15 and 16, an example of a solar cell according to the embodiment of the invention may further include a first conductive line P141, a second conductive line P142, and an insulating member 200, in addition to a semiconductor substrate 110, an anti-reflection layer 130, an emitter region 121, a back surface field region 172, a plurality of first electrodes C141, and a plurality of second electrodes C142 which are described with reference to FIGS. 12 and 13. The insulating member 200 may be omitted in the embodiment of the invention, if necessary or desired.

Since the semiconductor substrate 110, the anti-reflection layer 130, the emitter region 121, and the back surface field region 172 were described above with reference to FIGS. 12 and 13, a further description may be briefly made or may be entirely omitted.

FIG. 13 shows that the first electrodes C141 include a plurality of first finger electrodes C141F and a first electrode pad C141P and the second electrodes C142 include a plurality of second finger electrodes C142F and a second electrode pad C142P, as an example. However, as shown in (a) of FIG. 17, the first electrode pad C141P and the second electrode pad C142P may be respectively omitted in the first electrodes C141 and the second electrodes C142.

As shown in (c) of FIG. 17, the first conductive line P141 may include a plurality of first connectors PC141 and a first pad PP141. As shown in FIG. 15, the first connectors PC141 may be connected to the plurality of first electrodes C 141. Further, as shown in (c) of FIG. 17, one side of the first pad PP141 may be connected to ends of the first connectors PC141, and the other side may be connected to an interconnector IC. The first pad PP141 is described in detail below with reference to FIG. 17.

As shown in (c) of FIG. 17, the second conductive line P142 may include a plurality of second connectors PC142 and a second pad PP142. As shown in FIGS. 15 and 16, the second connectors PC142 may be connected to the plurality of second electrodes C142. Further, as shown in (c) of FIG. 17, one side of the second pad PP142 may be connected to ends of the second connectors PC142, and the other side may be connected to the interconnector IC. The second pad PP142 is described in detail below with reference to FIG. 17.

The first conductive line P141 may be electrically connected to the first electrode C141 using a conductive adhesive CA formed of a conductive material, and the second conductive line P142 may be electrically connected to the second electrode C142 using the conductive adhesive CA.

A material of the conductive adhesive CA is not particularly limited as long as it is a conductive material. However, it may be preferable, but not required, that a conductive material having a melting point of a relatively low temperature, for example, about 130° C. to 250° C. is used.

For example, the conductive adhesive CA may use a solder paste containing tin (Sn)-based metal, a conductive adhesive paste or a conductive adhesive film, in which tin (Sn)-based metal particles are distributed in an insulating resin, etc.

Further, an insulating layer IL may be positioned between the first electrode C141 and the second electrode C142 and between the first conductive line P141 and the second conductive line P142, thereby preventing the short circuit. A material of the insulating layer IL is not particularly limited as long as it is a resin formed of insulating material. For example, a silicon resin or an epoxy resin may be used.

FIGS. 15 and 16 show that the first electrode C141 overlaps the first connector PC141 of the first conductive line P141, and the second electrode C142 overlaps the second connector PC142 of the second conductive line P142, as an example.

On the contrary, the first electrode C141 may overlap the second connector PC142 of the second conductive line P142, and the second electrode C142 may overlap the first connector PC141 of the first conductive line P141.

In this instance, an insulating layer IL for preventing the short circuit may be positioned between the first electrode C141 and the second connector PC142 of the second conductive line P142 and between the second electrode C142 and the first connector PC141 of the first conductive line P141.

The insulating member 200 may be disposed on back surfaces of the first conductive line P141 and the second conductive line P142.

A material of the insulating member 200 is not particularly limited as long as it is an insulating material. However, it may be preferable, but not required, that a melting point of the material of the insulating member 200 is higher than the melting point of the conductive adhesive CA. For example, the insulating member 200 may be formed of an insulating material having a melting point equal to or higher than about 300° C.

More specifically, the insulating member 200 may be formed of at least one of polyimide, epoxy-glass, polyester, or bismaleimide triazine (BT) resin, each of which has a thermal resistance to a high temperature.

The insulating member 200 may be formed in the form of a flexible film or in the form of a hard plate which is not flexible.

In the solar cell according to the embodiment of the invention, each insulating member 200 and each semiconductor substrate 110 may be connected to each other to form an individual element in a state where the first and second conductive lines P141 and P142 are previously formed on a front surface of the insulating member 200 and the first and second electrodes C141 and C142 are previously formed on the back surface of the semiconductor substrate 110.

Namely, only one semiconductor substrate 110 may be attached and connected to one insulating member 200. In other words, one semiconductor substrate 110 and one insulating member 200 may be attached to each other to form an individual integrated type element, thereby forming a solar cell.

When one semiconductor substrate 110 and one insulating member 200 are attached to each other to form one individual integrated type element, an example of a pattern of the plurality of first and second electrodes C141 and C142 formed on a back surface of one semiconductor substrate 110 and an example of a pattern of the first and second conductive lines P141 and P142 formed on a front surface of one insulating member 200 are described below.

The solar cell according to the embodiment of the invention may form an individual integrated type element by attaching and connecting the front surface of the insulating member 200 having the pattern shown in (c) and (d) of FIG. 17 to the back surface of the semiconductor substrate 110 having the pattern shown in (a) and (b) of FIG. 17. Namely, the insulating member 200 and the semiconductor substrate 110 may have one-to-one connection.

In this instance, as shown in (a) and (b) of FIG. 17, the plurality of first electrodes C141 and the plurality of second electrodes C142 may be separated from each other on the back surface of the semiconductor substrate 110 shown in FIGS. 15 and 16 and may extend in the first direction x.

Further, as shown in (c) and (d) of FIG. 17, the first conductive line P141 and the second conductive line P142 may be formed on the front surface of the insulating member 200 according to the embodiment of the invention.

As described above, the first conductive line P141 may include the first connectors PC141 and the first pad PP141. As shown in (c) of FIG. 17, the first connectors PC141 may extend in the first direction x, and the first pad PP141 may extend in the second direction y. One side of the first pad PP141 may be connected to the ends of the first connectors PC141, and the other side may be connected to the interconnector IC.

Further, the second conductive line P142 may include the second connectors PC142 and the second pad PP142. As shown in (c) of FIG. 17, the second connectors PC142 may be separated from the first connectors PC141 and may extend in the first direction x, and the second pad PP142 may extend in the second direction y. One side of the second pad PP142 may be connected to the ends of the second connectors PC142, and the other side may be connected to the interconnector IC.

In the embodiment disclosed herein, the first connectors PC141 may be separated from the second pad PP142, and the second connectors PC142 may be separated from the first pad PP141.

Accordingly, the first pad PP141 may be formed at one end of the front surface of the insulating member 200 in the first direction x, and the second pad PP142 may be formed at the other end of the insulating member 200.

The solar cell according to the embodiment of the invention may form an individual integrated type element by attaching and connecting only one insulating member 200 to one semiconductor substrate 110, thereby more easily performing a manufacturing process of the solar cell module. Further, even if the semiconductor substrate 110 included in any one solar cell is broken or damaged during the manufacturing process of the solar cell module, only the broken or damaged solar cell forming the individual integrated type element may be replaced. Hence, the process yield of the solar cell module may be further improved.

Further, the solar cell forming the individual integrated type element may minimize a thermal expansion stress applied to the semiconductor substrate 110 when the solar cell or the solar cell module is manufactured.

When an area of the insulating member 200 is equal to or greater than an area of the semiconductor substrate 110, a formation space of the interconnector IC for connecting the adjacent solar cells may be sufficiently secured in the front surface of the insulating member 200. Thus, the area of the insulating member 200 may be greater than the area of the semiconductor substrate 110.

In the embodiment disclosed herein, the front surface of the insulating member 200 may be attached to the back surface of the semiconductor substrate 110. Hence, the first electrodes C141 may be connected to the first conductive line P141, and the second electrodes C142 may be connected to the second conductive line P142.

An example where the solar cell forms the individual integrated type element by attaching and connecting only one insulating member 200 to one semiconductor substrate 110 is described below.

As shown in FIG. 18, one semiconductor substrate 110 and one insulating member 200 may completely overlap each other to form an individual solar cell element.

For example, as shown in FIG. 19A, the first electrode C141 formed on the back surface of the semiconductor substrate 110 and the first connector PC141 formed on the front surface of the insulating member 200 may overlap each other and may be electrically connected to each other using the conductive adhesive CA.

Further, the second electrode C142 formed on the back surface of the semiconductor substrate 110 and the second connector PC142 formed on the front surface of the insulating member 200 may overlap each other and may be electrically connected to each other using the conductive adhesive CA.

A space between the first electrode C141 and the second electrode C142 may be filled with the insulating layer IL, and also a space between the first connector PC141 and the second connector PC142 may be filled with the insulating layer IL.

As shown in FIG. 19B, a space between the second connector PC142 and the first pad PP141 may be filled with the insulating layer IL. As shown in FIG. 19C, a space between the first connector PC141 and the second pad PP142 may be filled with the insulating layer IL.

As shown in FIG. 18, the first pad PP141 and the second pad PP142 may respectively include first areas PP141-S1 and PP142-S1 overlapping the semiconductor substrate 110 and second areas PP141-S2 and PP142-S2 not overlapping the semiconductor substrate 110.

The interconnector IC may be connected to the second area PP141-S2 of the first pad PP141 and the second area PP142-S2 of the second pad PP142, which are provided to secure a connection space of the interconnector IC.

Because the first pad PP141 and the second pad PP142 according to the embodiment of the invention respectively include the second areas PP141-S2 and PP142-S2, the connection of the interconnector IC may be more easily performed. Further, when the interconnector IC is connected to the insulating member 200, the thermal expansion stress of the semiconductor substrate 110 may be minimized.

Thus, the interconnector IC may be connected to the first pad PP141 or the second pad PP142, thereby connecting the plurality of solar cells CEs.

Even when the insulating member 200 is omitted unlike FIGS. 15 to 19C, the interconnector IC may be connected to the front surface of the first pad PP141 or the front surface of the second pad PP142 as shown in FIG. 9.

So far, the embodiment of the invention described that the first and second electrodes C141 and C142 formed on the semiconductor substrate 110 and the first and second connectors PC141 and PC142 formed on the insulating member 200 overlap each other and are connected to each other in a direction parallel to each other. On the contrary, the first and second electrodes C141 and C142 formed on the semiconductor substrate 110 and the first and second connectors PC141 and PC142 formed on the insulating member 200 may overlap each other and may be connected to each other in a cross direction therebetween.

Further, each of the first and second connectors PC141 and PC142 is not formed in the plural and may be formed as one sheet electrode. In this instance, the plurality of first electrodes C141 and the plurality of second electrodes C142 may be connected to the first connector PC141 and the second connector PC142, each of which is the sheet electrode.

In the solar cell module according to the fifth embodiment of the invention, the first and second conductive lines P141 and P142 are formed on the insulating member 200 and respectively include the first and second connectors PC141 and PC142 extending in the first direction x and the first and second pads PP141 and PP142 extending in the second direction y. Unlike the fifth embodiment of the invention, the insulating member 200 may be omitted, and the first and second pads PP141 and PP142 may be omitted in the first and second conductive lines P141 and P142.

Hereinafter, a solar cell module, in which the insulating member 200 is omitted, and the first and second pads PP141 and PP142 are omitted in the first and second conductive lines P141 and P142, is described.

Figure 20:
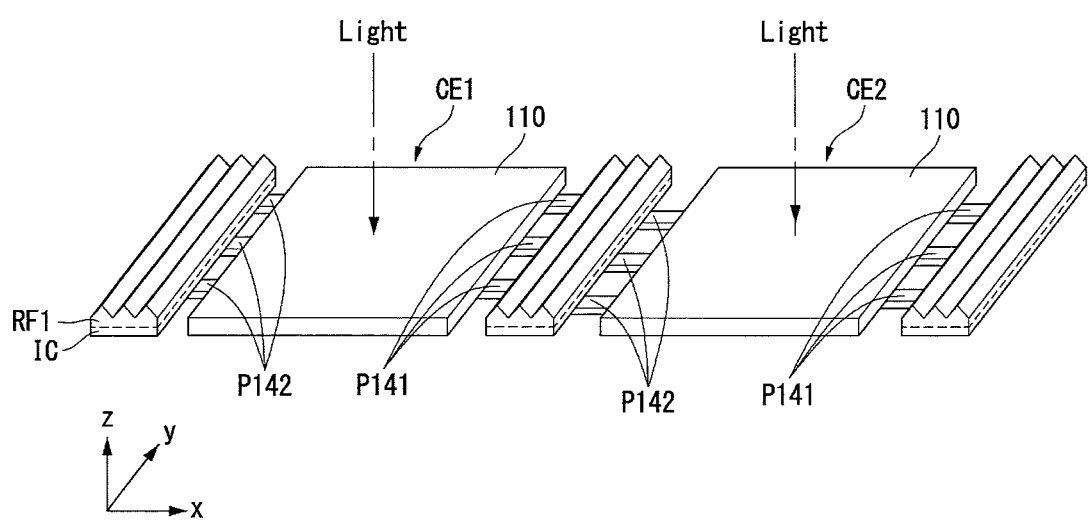
FIGS. 20 to 22 illustrate a solar cell module according to a sixth embodiment of the invention.
Figure 21:
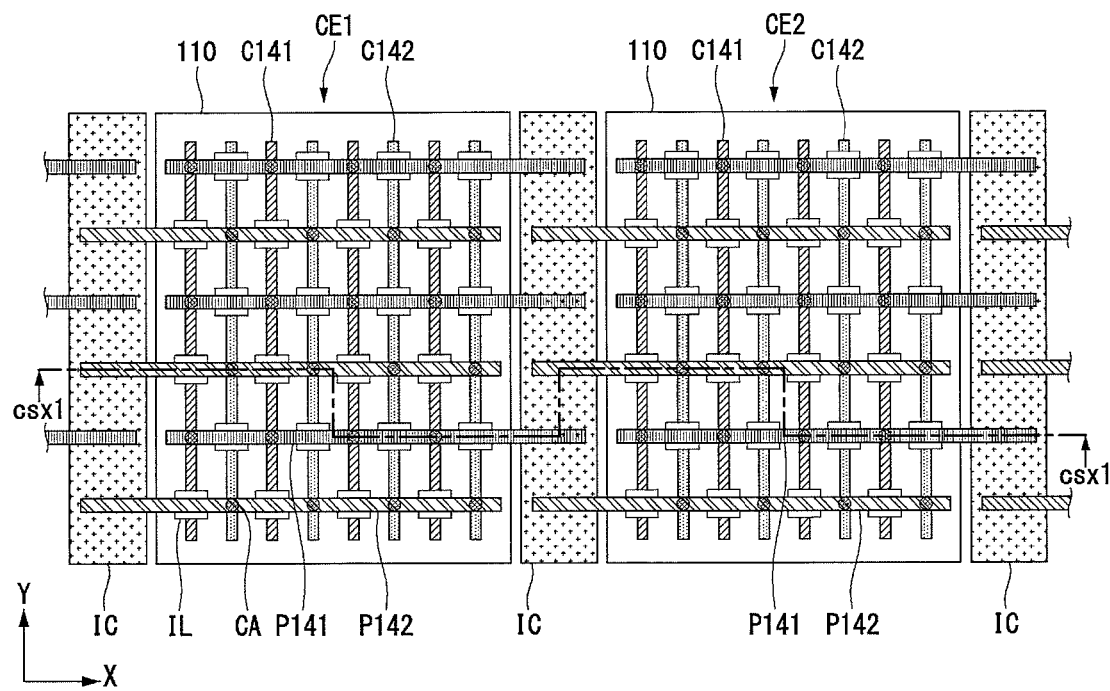
Figure 22:
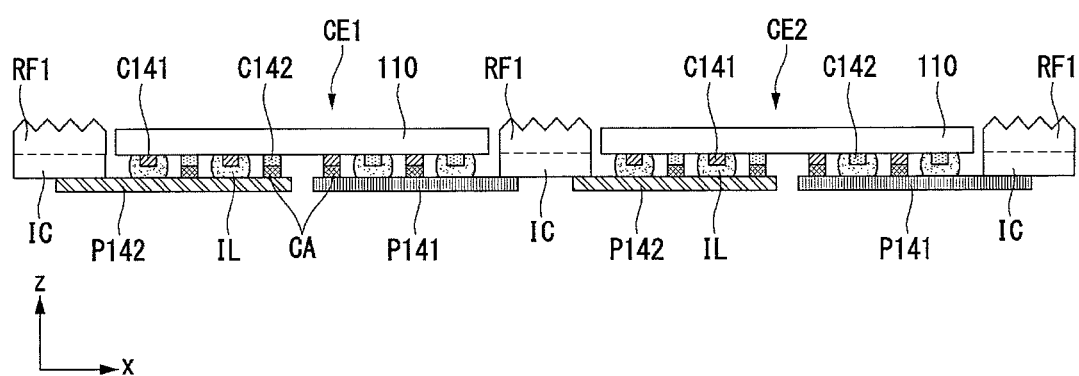

FIGS. 20 to 22 illustrate a solar cell module according to a sixth embodiment of the invention.

More specifically, FIG. 20 shows that a plurality of solar cells are connected using an interconnector in the solar cell module according to the sixth embodiment of the invention. FIG. 21 shows a structure of a back surface of the solar cell module shown in FIG. 20, and FIG. 22 is a cross-sectional view taken along line csx1-csx1 of FIG. 21.

The description of structures and components identical or equivalent to those illustrated in the first to fifth embodiments of the invention is omitted in the sixth embodiment of the invention, and a difference therebetween is mainly described.

Further, the description of the first to fifth embodiments of the invention may be repeatedly applied to the sixth embodiment of the invention.

In the sixth embodiment of the invention, first and second solar cells CE1 and CE2 mean two solar cells belonging to one string selected among the plurality of strings shown in FIG. 1.

As shown in FIGS. 20 and 21, the first and second solar cells CE1 and CE2 may be disposed in the first direction x and may be electrically connected in series. Each of the first and second solar cells CE1 and CE2 may include a semiconductor substrate 110, of which a front surface receives light, and a plurality of first electrodes C141 and a plurality of second electrodes C142 which are formed on a back surface of the semiconductor substrate 110 and are separated from each other.

The structure of the first and second solar cells CE1 and CE2 is substantially the same as the structure shown in (a) and (b) of FIG. 17. However, as shown in FIG. 21, the plurality of first electrodes C141 and the plurality of second electrodes C142 may extend in not the first direction x but the second direction y.

A first conductive line P141 and a second conductive line P142 may be connected to each of the first and second solar cells CE1 and CE2. Each of the first and second conductive lines P141 and P142 may be in the plural. The first and second conductive lines P141 and P142 may be a wire having a circular cross section or may have a ribbon shape, in which a width is greater than a thickness.

The first and second conductive lines P141 and P142 may extend in the first direction x, which is the same as a series connection direction of the first and second solar cells CE1 and CE2.

Thus, the first and second conductive lines P141 and P142 may cross the plurality of first and second electrodes C141 and C142.

In each of the first and second solar cells CE1 and CE2, the plurality of first conductive lines P141 may be connected to the plurality of first electrodes C141, and the plurality of second conductive lines P142 may be connected to the plurality of first electrodes C142.

More specifically, as shown in FIGS. 20 and 22, in each of the first and second solar cells CE1 and CE2, the plurality of first conductive lines P141 may be connected to the plurality of first electrodes C141 using a conductive adhesive CA in an overlap portion between the first conductive lines P141 and the first electrodes C141 and may be insulated from one another through an insulating layer IL formed between the first conductive lines P141 and the second electrodes C142 in an overlap portion between the first conductive lines P141 and the second electrodes C 142.

Further, in each of the first and second solar cells CE1 and CE2, the plurality of second conductive lines P142 may be connected to the plurality of second electrodes C142 using the conductive adhesive CA in an overlap portion between the second conductive lines P142 and the second electrodes C142 and may be insulated from one another through the insulating layer IL formed between the second conductive lines P142 and the first electrodes C141 in an overlap portion between the second conductive lines P142 and the first electrodes C141.

In the sixth embodiment of the invention, a material of the conductive adhesive CA and a material of the insulating layer IL may be substantially the same as the fifth embodiment of the invention.

As shown in FIG. 21, one end of each of the first and second conductive lines P141 and P142 may protrude to the outside of the semiconductor substrate 110 when viewing the solar cell module from its back surface.

One end of each of the first and second conductive lines P141 and P142 protruding to the outside of the semiconductor substrate 110 may be connected to the interconnector IC for connecting the first and second solar cells CE1 and CE2 in series.

Thus, the interconnector IC may connect the first conductive line P141 connected to the first solar cell CE1 to the second conductive line P142 connected to the second solar cell CE2 in series in the first direction x.

As shown in FIG. 21, a length of the interconnector IC in the first direction x may be shorter than a length of the interconnector IC in the second direction y crossing the first direction x.

As shown in FIG. 22, a first reflector RF1 may be formed on a front surface of the interconnector IC.

The characteristics of the first reflector RF1 according to the first to fifth embodiments of the invention and the first to third modified examples may be applied to the first reflector RF1 according to the sixth embodiment of the invention.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
   a plurality of strings each including a plurality of solar cells, which are connected in series to one another through an interconnector, each of the plurality of strings extending in a first direction;
   a front transparent substrate disposed on front surfaces of the plurality of strings;
   a first encapsulant disposed between the front transparent substrate and the front surfaces of the plurality of strings;
   a first reflector disposed in a first space between the plurality of solar cells included in each string, which are separated from one another in the first direction corresponding to a longitudinal direction of the each string, the first reflector reflecting incident light; and
   a second reflector disposed in a second space between the plurality of strings, which are separated from one another in a second direction crossing the first direction, the second reflector reflecting incident light,
   wherein the first reflector is formed on a front surface of the interconnector and forms one body along with the interconnector, and
   wherein, when viewing the solar cell module from its front surface, each of the interconnector, the first reflector, and the second reflector does not overlap semiconductor substrates included in the plurality of solar cells, and is spatially separated from the semiconductor substrates included in the plurality of solar cells.

2. The solar cell module of claim 1, wherein each of the plurality of solar cells includes:
   a semiconductor substrate configured to form a p-n junction; and
   a plurality of first electrodes and a plurality of second electrodes which are formed on a back surface of the semiconductor substrate and are separated from each other.

3. The solar cell module of claim 2, wherein the first reflector is disposed between the semiconductor substrates included in the plurality of solar cells of each string and extends in the second direction,
   wherein the second reflector is disposed between the semiconductor substrate of a solar cell included in one string and the semiconductor substrate of a solar cell included in another string adjacent to the one string and extends in the first direction.

4. The solar cell module of claim 2, wherein each of the plurality of solar cells further includes:
   a first conductive line connected to the plurality of first electrodes using a conductive adhesive; and
   a second conductive line connected to the plurality of second electrodes using the conductive adhesive.

5. The solar cell module of claim 4, wherein the interconnector is connected to the first conductive line connected to one solar cell and the second conductive line connected to another solar cell adjacent to the one solar cell.

6. The solar cell module of claim 1, wherein a sum of a thickness of the first reflector and a thickness of the interconnector is greater than a thickness of a semiconductor substrate included in each solar cell.

7. The solar cell module of claim 1, wherein a plurality of uneven portions are formed on a front surface of each of the first reflector and the second reflector.

8. The solar cell module of claim 7, wherein the plurality of uneven portions of the first reflector include a plurality of first protrusions each extending in the second direction.

9. The solar cell module of claim 8, wherein an inclination angle of the first protrusions in the first reflector, positioned between the solar cells adjacent to each other in the first direction, increases as it goes farther away from the adjacent solar cells.

10. The solar cell module of claim 7, wherein the plurality of uneven portions of the second reflector include a plurality of second protrusions each extending in the first direction.

11. The solar cell module of claim 10, wherein an inclination angle of the second protrusions in the second reflector, positioned between the solar cells adjacent to each other in the second direction, increases as it goes farther away from the adjacent solar cells.

12. The solar cell module of claim 1, wherein a thickness of the second reflector is greater than a thickness of a semiconductor substrate included in each solar cell.

13. The solar cell module of claim 1, wherein the first and second reflectors each contain a conductive material.

14. The solar cell module of claim 1, wherein the first and second reflectors each contain an insulating material.

15. The solar cell module of claim 1, wherein each of the first and second reflectors includes a body part formed of an insulating material and a coating part formed of a metal material coated on a front surface of the body part.

16. The solar cell module of claim 1, wherein refractive indexes of the first and second reflectors are different from a refractive index of the first encapsulant.

17. The solar cell module of claim 1, further comprising an outermost reflector having a plurality of uneven portions positioned outside the plurality of solar cells when viewing the solar cell module from its front surface,
   wherein an inclined surface formed by the plurality of uneven portions of the outermost reflector faces only the plurality of solar cells positioned inside the outermost reflector.

* * * * *